United States Patent
Kawato et al.

(10) Patent No.: US 8,841,142 B2
(45) Date of Patent: *Sep. 23, 2014

(54) VAPOR DEPOSITION METHOD, VAPOR DEPOSITION DEVICE AND ORGANIC EL DISPLAY DEVICE

(75) Inventors: Shinichi Kawato, Osaka (JP); Satoshi Inoue, Osaka (JP); Tohru Sonoda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/989,053

(22) PCT Filed: Dec. 13, 2011

(86) PCT No.: PCT/JP2011/078757
§ 371 (c)(1),
(2), (4) Date: May 22, 2013

(87) PCT Pub. No.: WO2012/086456
PCT Pub. Date: Jun. 28, 2012

(65) Prior Publication Data
US 2013/0252353 A1    Sep. 26, 2013

(30) Foreign Application Priority Data

Dec. 20, 2010 (JP) ................ 2010-283476

(51) Int. Cl.
| | |
|---|---|
| *H01L 51/56* | (2006.01) |
| *H01L 51/00* | (2006.01) |
| *H01L 21/66* | (2006.01) |
| *C23C 14/12* | (2006.01) |
| *C23C 14/04* | (2006.01) |
| *C23C 14/24* | (2006.01) |

(52) U.S. Cl.
CPC .............. *H01L 22/10* (2013.01); *H01L 51/56* (2013.01); *C23C 14/12* (2013.01); *C23C 14/042* (2013.01); *C23C 14/243* (2013.01); *H01L 51/0011* (2013.01)
USPC ............. 438/14; 118/720; 118/712; 118/504; 438/34; 438/5; 438/46; 427/66; 257/40

(58) Field of Classification Search
CPC ...... C23C 14/042; C23C 14/24; C23C 14/54; C23C 14/243; C23C 14/12; H01L 27/3211; H01L 51/001; H01L 51/56; H01L 51/0011
USPC ............ 118/720, 712, 504; 438/34, 46, 5, 14; 427/66; 257/40
See application file for complete search history.

(56) References Cited

U.S. PATENT DOCUMENTS

| | | |
|---|---|---|
| 5,742,129 A | 4/1998 | Nagayama et al. |
| 6,294,892 B1 | 9/2001 | Utsugi et al. |

(Continued)

FOREIGN PATENT DOCUMENTS

| | | |
|---|---|---|
| JP | 8-227276 A | 9/1996 |
| JP | 2000-188179 A | 7/2000 |

(Continued)

OTHER PUBLICATIONS

International Search Report received for PCT Patent Application No. PCT/JP2011/078757, mailed on Mar. 13, 2012, 5 pages (2 pages of English Translation and 3 pages of Official copy).

*Primary Examiner* — Jarrett Stark
*Assistant Examiner* — Bitew Dinke
(74) *Attorney, Agent, or Firm* — Morrison & Foerster LLP

(57) ABSTRACT

A coating film (90) is formed by causing vapor deposition particles (91) discharged from a vapor deposition source opening (61) of a vapor deposition source (60) to pass through a space (82) between a plurality of limiting plates (81) of a limiting plate unit (80) and a mask opening (71) of a vapor deposition mask in this order and adhere to a substrate while the substrate is moved relative to the vapor deposition mask in state in which the substrate (10) and the vapor deposition mask (70) are spaced apart at a fixed interval. It is determined whether or not it is necessary to correct the position of at least one of the plurality of limiting plates in the X axis direction, and in the case where it is necessary to correct the position, the position of at least one of the plurality of limiting plates in the X axis direction is corrected. Accordingly, a coating film whose edge blur is suppressed can be stably formed at a desired position on a large-sized substrate.

5 Claims, 16 Drawing Sheets

(56) References Cited

U.S. PATENT DOCUMENTS

| | | | |
|---|---|---|---|
| 8,609,442 B2* | 12/2013 | Inoue et al. | 438/5 |
| 2004/0115338 A1* | 6/2004 | Yoneda | 427/66 |
| 2006/0186804 A1* | 8/2006 | Sakakura et al. | 313/506 |
| 2007/0178708 A1* | 8/2007 | Ukigaya | 438/758 |
| 2010/0297348 A1* | 11/2010 | Lee et al. | 427/248.1 |
| 2010/0297349 A1* | 11/2010 | Lee et al. | 427/248.1 |
| 2010/0330712 A1* | 12/2010 | Lee et al. | 438/22 |
| 2011/0033964 A1* | 2/2011 | Oh et al. | 438/34 |
| 2011/0045617 A1* | 2/2011 | Kang et al. | 438/22 |
| 2011/0053300 A1* | 3/2011 | Ryu et al. | 438/34 |
| 2011/0053301 A1* | 3/2011 | Kang et al. | 438/34 |
| 2012/0083061 A1* | 4/2012 | Kang et al. | 438/46 |
| 2012/0183676 A1* | 7/2012 | Sonoda et al. | 427/8 |
| 2013/0059063 A1* | 3/2013 | Kawato et al. | 427/66 |
| 2013/0089941 A1* | 4/2013 | Sonoda et al. | 438/46 |
| 2013/0181209 A1* | 7/2013 | Sonoda et al. | 257/40 |

FOREIGN PATENT DOCUMENTS

| | | | |
|---|---|---|---|
| JP | 2004-103269 A | | 4/2004 |
| JP | 2004-349101 A | | 12/2004 |
| JP | 2006-261109 A | | 9/2006 |
| JP | 2007-227359 A | | 9/2007 |
| JP | 2007227359 A | * | 9/2007 |
| JP | 2008-223102 A | | 9/2008 |
| JP | 2010-270397 A | | 12/2010 |

* cited by examiner

VAPOR DEPOSITION METHOD, VAPOR DEPOSITION DEVICE AND ORGANIC EL DISPLAY DEVICE

CROSS REFERENCE TO RELATED APPLICATIONS

This is a U.S. National Phase patent application of PCT/JP2011/078757, filed Dec. 13, 2011, which claims priority to Japanese patent application no. 2010-283476, filed Dec. 20, 2010, each of which is hereby incorporated by reference in the present disclosure in its entirety.

TECHNICAL FIELD

The present invention relates to a vapor deposition method and a vapor deposition device for forming a coating film having a predetermined pattern on a substrate. The present invention also relates to an organic EL (Electro Luminescence) display device including a light emitting layer formed by vapor deposition.

BACKGROUND ART

In recent years, flat panel displays are used in various commodity products and fields, and thus flat panel displays are required to have a large size, high image quality and low power consumption.

Under the circumstances, organic EL display devices, which include an organic EL element that utilizes electro luminescence of an organic material, are attracting great attention as all-solid state flat panel displays that are excellent as having capability of low voltage operation, quick responsivity and light emission.

Active matrix type organic EL display devices, for example, are provided with a thin film-like organic EL element on a substrate having a TFT (thin film transistor). In the organic EL element, organic EL layers including a light emitting layer are laminated between a pair of electrodes. The TFT is connected to one of the pair of electrodes. Then, voltage is applied across the pair of electrodes so as to cause the light emitting layer to emit light, whereby an image is displayed.

In a full-color organic EL display device, generally, organic EL elements including light emitting layers of respective colors of red (R), green (G) and blue (B) are formed and arranged on a substrate as sub-pixels. By causing these organic EL elements to selectively emit light at the desired brightness by using the TFT, a color image is displayed.

In order to manufacture an organic EL display device, it is necessary to form a light emitting layer made of organic light emitting materials that emit respective colors in a predetermined pattern for each organic EL element.

Known methods for forming light emitting layers in a predetermined pattern are vacuum vapor deposition method, inkjet method and laser transfer method. For example, the vacuum vapor deposition method is often used for low molecular organic EL display devices (OLEDs).

In the vacuum vapor deposition method, a mask (also called a "shadow mask") having a predetermined pattern of openings is used. The deposition surface of a substrate having the mask closely fixed thereto is disposed so as to oppose a vapor deposition source. Then, vapor deposition particles (film forming material) from the vapor deposition source are deposited onto the deposition surface through the openings of the mask, whereby a predetermined pattern of a thin film is formed. Vapor deposition is performed for each color of the light emitting layer, which is referred to as "vapor deposition by color".

For example, Patent Documents 1 and 2 disclose a method for performing vapor deposition by color in which light emitting layers for respective colors are formed by sequentially moving a mask with respect to a substrate. With such a method, a mask having a size equal to that of a substrate is used, and the mask is fixed so as to cover the deposition surface of the substrate at the time of vapor deposition.

With conventional methods for performing vapor deposition by color as described above, as the substrate becomes larger, the mask needs to be large accordingly. However, when the mask is made large, a gap is likely to appear between the substrate and the mask by the mask being bent by its own weight or being extended. In addition, the size of the gap varies depending on the position of the deposition surface of the substrate. For this reason, it is difficult to perform highly accurate patterning, and it is therefore difficult to achieve high definition due to the occurrence of positional offset between the mask and the substrate during vapor deposition and the occurrence of color mixing.

Also, when the mask is made large, the mask as well as a frame or the like for holding the mask need to be gigantic, which increases the weight and makes handling thereof difficult. As a result, there is a possibility that productivity and safety might be compromised. Also, the vapor deposition device and devices that are used together therewith need to be made gigantic and complex as well, which makes device designing difficult and increases the installation cost.

For the reasons described above, the conventional methods for vapor deposition by color that are described in Patent Documents 1 and 2 are difficult to adapt to large-sized substrates, and it is difficult to perform vapor deposition by color on large-sized substrates such as those having a size exceeding 60 inches on a mass manufacturing level.

Patent Document 3 describes a vapor deposition method for causing vapor deposition particles discharged from a vapor deposition source to adhere to a substrate after causing the vapor deposition particles to pass through a mask opening of a vapor deposition mask while relatively moving the vapor deposition source and the vapor deposition mask with respect to the substrate. With this vapor deposition method, even in the case of large-sized substrates, it is not necessary to increase the size of the vapor deposition mask in accordance with the size of the substrates.

Patent Document 4 describes that a vapor deposition beam direction adjustment plate having vapor deposition beam-pass-through holes formed therein whose diameter is approximately 0.1 mm to 1 mm is disposed between a vapor deposition source and a vapor deposition mask. By causing the vapor deposition particles discharged from the vapor deposition beam emission hole of the vapor deposition source to pass through the vapor deposition beam-pass-through holes formed in the vapor deposition beam direction adjustment plate, the directivity of vapor deposition beam can be increased.

CITATION LIST

Patent Document

Patent Document 1: JP H8-227276A
Patent Document 2: JP 2000-188179A
Patent Document 3: JP 2004-349101A
Patent Document 4: JP 2004-103269A

DISCLOSURE OF INVENTION

Problem to be Solved by the Invention

According to the vapor deposition method described in Patent Document 3, a vapor deposition mask smaller than the substrate can be used, and therefore vapor deposition can be easily performed on large-sized substrates.

However, because it is necessary to relatively move the vapor deposition mask with respect to the substrate, the substrate and the vapor deposition mask need to be spaced apart from each other. With Patent Document 3, vapor deposition particles that fly from various directions may enter the mask openings of the vapor deposition mask, and therefore the width of the coating film formed on the substrate is longer than the width of the mask opening, resulting blur at the edge of the coating film.

Patent Document 4 describes that the directivity of the vapor deposition beam entering the vapor deposition mask is improved by the vapor deposition beam direction adjustment plate.

However, in the actual vapor deposition step, the temperature of the vapor deposition source and the vapor deposition beam direction adjustment plate is increased, and the vapor deposition source and the vapor deposition beam direction adjustment plate thermally expand in accordance with the respective thermal coefficients. Also, because a large amount of vapor deposition material adhere to the vapor deposition beam direction adjustment plate, it is necessary to regularly replace the vapor deposition beam direction adjustment plate by a new one. Relative positional offset may occur between the vapor deposition beam emission holes of the vapor deposition source and the vapor deposition beam-pass-through holes of the vapor deposition beam direction adjustment plate due to such thermal expansions and replacements. The diameter of the vapor deposition beam-pass-through holes is as small as approximately 0.1 mm to 1 mm, and therefore the vapor deposition particles discharged from the vapor deposition beam emission holes may not be able to pass through the vapor deposition beam-pass-through holes due to only slight positional offset between the vapor deposition beam emission holes and vapor deposition beam-pass-through holes. In this case, it is not possible to form a coating film at a desired position on the substrate.

It is an object of the present invention to provide a vapor deposition method and a vapor deposition device that are capable of stably forming a coating film in which edge blur is suppressed at a desired position on the substrate and that are applicable to large-sized substrates.

It is another object of the present invention to provide a large-sized organic EL display device that is excellent in terms of reliability and display quality.

Means for Solving Problem

The vapor deposition method of the present invention is a vapor deposition method for forming a coating film having a predetermined pattern on a substrate, and includes a vapor deposition step of forming the coating film by causing vapor deposition particles to adhere onto the substrate. The vapor deposition step is a step in which with the use of a vapor deposition unit including a vapor deposition source having a plurality of vapor deposition source openings that are disposed at different positions in a first direction, a vapor deposition mask disposed between the plurality of vapor deposition source openings and the substrate, and a limiting plate unit that includes a plurality of limiting plates disposed along the first direction and that is disposed between the vapor deposition source and the vapor deposition mask, the vapor deposition particles that have been discharged from the plurality of vapor deposition source openings and that have passed through a space between the limiting plates neighboring in the first direction and a plurality of mask openings formed in the vapor deposition mask are caused to adhere onto the substrate while one of the substrate and the vapor deposition unit is moved relative to the other along a second direction orthogonal to the normal line direction of the substrate and the first direction in a state in which the substrate and the vapor deposition mask are spaced apart at a fixed interval. The vapor deposition method further includes a determination step of determining whether or not it is necessary to correct the position of at least one of the plurality of limiting plates in the first direction and a correction step of correcting the position of at least one of the plurality of limiting plates in the first direction in a case where it has been determined in the determination step that it is necessary to correct the position.

An organic EL display device according to the present invention includes a light emitting layer formed by using the above vapor deposition method of the present invention.

The vapor deposition device of the present invention is a vapor deposition device for forming a coating film having a predetermined pattern on a substrate, and includes a vapor deposition unit including a vapor deposition source having a plurality of vapor deposition source openings that are disposed at different positions in a first direction, a vapor deposition mask disposed between the plurality of vapor deposition source openings and the substrate, and a limiting plate unit that includes a plurality of limiting plates disposed along the first direction and that is disposed between the vapor deposition source and the vapor deposition mask, a moving mechanism that moves one of the substrate and the vapor deposition unit relative to the other along a second direction orthogonal to the normal line direction of the substrate and the first direction in a state in which the substrate and the vapor deposition mask are spaced apart at a fixed interval, and a position adjustment mechanism that corrects the position of at least one of the plurality of limiting plates in the first direction.

Effects of the Invention

According to the vapor deposition method and vapor deposition device of the present invention, the vapor deposition particles that have passed through the mask openings formed in the vapor deposition mask are caused to adhere to the substrate while one of the substrate and the vapor deposition unit is moved relative to the other, and therefore a vapor deposition mask that is smaller than the substrate can be used. It is therefore possible to form a coating film even on a large-sized substrate by vapor deposition.

The plurality of limiting plates provided between the vapor deposition source opening and the vapor deposition mask selectively capture the vapor deposition particles that have entered a space between limiting plates neighboring in the first direction according to the incidence angle of the vapor deposition particles, and thus only the vapor deposition particles entering at a predetermined incidence angle or less enter the mask openings. As a result, the maximum incidence angle of the vapor deposition particles with respect to the substrate becomes small, and it is therefore possible to suppress blur that occurs at the edge of the coating film formed on the substrate.

The relative positional offset of the limiting plates with respect to the vapor deposition source openings is reduced by correcting a position of at least one of the plurality of limiting plates in the first direction, and therefore it is possible to stably form a coating film at a desired position.

The organic EL display device of the present invention includes a light emitting layer formed by using the vapor deposition method described above, and therefore the positional offset of the light emitting layer and edge blur in the light emitting layer are suppressed. Accordingly, it is possible to provide an organic EL display device that has excellent reliability and display quality and that can be made in a large size.

DESCRIPTION OF THE INVENTION

Figure 1:
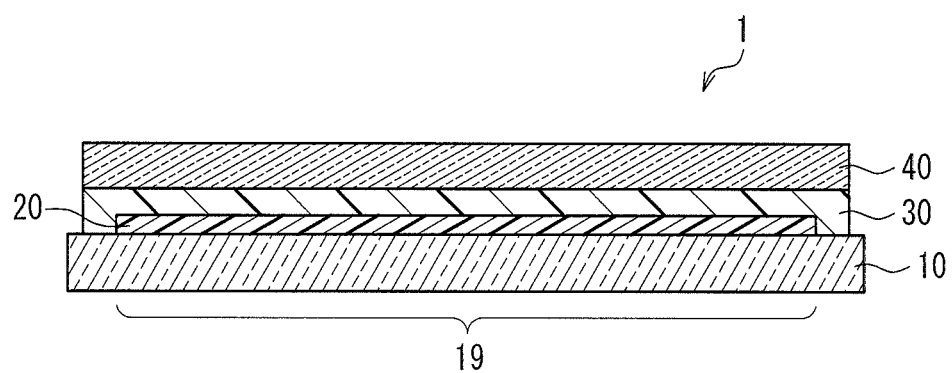
FIG. 1 is a cross-sectional view showing a schematic configuration of an organic EL display device.

The vapor deposition method of the present invention is a vapor deposition method for forming a coating film having a predetermined pattern on a substrate, and includes a vapor deposition step of forming the coating film by causing vapor deposition particles to adhere onto the substrate. The vapor deposition step is a step in which with the use of a vapor deposition unit including a vapor deposition source having a plurality of vapor deposition source openings that are disposed at different positions in a first direction, a vapor deposition mask disposed between the plurality of vapor deposition source openings and the substrate, and a limiting plate unit that includes a plurality of limiting plates disposed along the first direction and that is disposed between the vapor deposition source and the vapor deposition mask, the vapor deposition particles that have been discharged from the plurality of vapor deposition source openings and that have passed through a space between the limiting plates neighboring in the first direction and a plurality of mask openings formed in the vapor deposition mask are caused to adhere onto the substrate while one of the substrate and the vapor deposition unit is moved relative to the other along a second direction orthogonal to the normal line direction of the substrate and the first direction in a state in which the substrate and the vapor deposition mask are spaced apart at a fixed interval. The method further includes a determination step of determining whether or not it is necessary to correct the position of at least one of the plurality of limiting plates in the first direction and a correction step of correcting the position of at least one of the plurality of limiting plates in the first direction in a case where it has been determined in the determination step that it is necessary to correct the position.

It is preferable that the above-described vapor deposition method of the present invention further includes a measurement step of measuring the position of at least one of the plurality of limiting plates in the first direction and the position of at least one of the plurality of vapor deposition source openings in the first direction. In this case, it is preferable that it is determined whether or not it is necessary to correct the position in the determination step, based on the positions of the limiting plates and the vapor deposition source openings measured in the measurement step. With this preferred configuration, the relative position of the limiting plates in the first direction with respect to the vapor deposition source openings can be determined based on measured values of the limiting plates and the vapor deposition source openings at their respective positions, and therefore it is possible to accurately correct positional offset therebetween. As a result, accuracy in the position of the coating film is further increased. Also, the positions of the limiting plates and the vapor deposition source openings can be relatively easily measured, and therefore it is possible to quickly easily obtain data for determining whether or not it is necessary to correct the position.

It is preferable that in the above-described vapor deposition method of the present invention, the determination step and the correction step are performed before the vapor deposition step. With this preferred configuration, relative positional offset of the limiting plates in the first direction with respect to the vapor source openings can be corrected before vapor deposition, and therefore it is possible to effectively prevent the occurrence of positional offset of the coating film to be formed on the substrate.

The determination step and the correction step may be performed during the vapor deposition step. With this configuration, the relative positional offset of the limiting plates in the first direction with respect to the vapor deposition source openings that newly occurred during vapor deposition step can be corrected, and therefore it is possible to further reduce the positional offset of the coating film to be formed on the substrate.

It is preferable that the vapor deposition method further includes a step of performing a trial vapor deposition on a substrate for checking before the vapor deposition step. In this case, it is preferable that it is determined whether or not it is necessary to correct the position in the determination step, based on a result of evaluating a coating film formed on the substrate for checking. With this preferred configuration, it is not necessary to measure the positions of the vapor deposition source openings and the limiting plates in the first direction, and therefore the device therefore is not required. Accordingly, the configuration of the vapor deposition device is simplified and it is possible to reduce the device cost and the vapor deposition cost.

It is preferable that the positions of the plurality of limiting plates in the first direction are corrected by moving the entire limiting plate unit in the first direction in the correction step. With this preferred configuration, a mechanism for correcting (moving) the positions of the limiting plates in the first direction is simplified, and therefore it is possible to reduce the device cost and the vapor deposition cost.

It is preferable that the limiting plate unit is placed on a limiting plate tray, and the positions of the plurality of limiting plates in the first direction are corrected by moving the limiting plate tray in the first direction in the correction step. With this preferred configuration, the replacement of the limiting plate unit can be easily performed in a short time.

It is preferable that the limiting plate unit is divided into a plurality of unit parts in the first direction. In this case, it is preferable that the position of at least one of the plurality of limiting plates in the first direction is corrected by moving at least one of the plurality of unit parts in the first direction in the correction step. With this preferred configuration, the position can be more highly accurately corrected than the case where the position is corrected by moving the entire limiting plate unit in the first direction. Accordingly, the positional offset of the coating film to be formed on the substrate can be further reduced.

It is preferable that the coating film is a light emitting layer for an organic EL element. Accordingly, it is possible to provide an organic EL display device that has excellent reliability and display quality and that can be made in a large size.

The vapor deposition device of the present invention is a vapor deposition device for forming a coating film having a predetermined pattern on a substrate, and includes a vapor deposition unit including a vapor deposition source having a plurality of vapor deposition source openings that are disposed at different positions in a first direction, a vapor deposition mask disposed between the plurality of vapor deposition source openings and the substrate, and a limiting plate unit that includes a plurality of limiting plates disposed along the first direction and that is disposed between the vapor deposition source and the vapor deposition mask, a moving mechanism that moves one of the substrate and the vapor deposition unit relative to the other along a second direction orthogonal to the normal line direction of the substrate and the first direction in a state in which the substrate and the vapor deposition mask are spaced apart at a fixed interval, and a position adjustment mechanism that corrects the position of at least one of the plurality of limiting plates in the first direction.

It is preferable that the vapor deposition device further includes a limiting plate sensor that measures the position of at least one of the plurality of limiting plates in the first direction, and a vapor deposition source sensor that measures the position of at least one of the plurality of vapor deposition source openings in the first direction. With this preferred configuration, the relative position of the limiting plates in the first direction with respect to the vapor deposition source openings can be determined based on measured values of the limiting plates and the vapor deposition source openings at their respective positions, and therefore it is possible to accurately correct positional offset therebetween. As a result, accuracy in the position of the coating film is further increased. Also, the positions of the limiting plates and the vapor deposition source openings can be relatively easily measured, and therefore it is possible to quickly easily obtain data for determining whether or not it is necessary to correct the position.

It is preferable that the position adjustment mechanism moves the entire limiting plate unit in the first direction. With this preferred configuration, the configuration of a position adjustment mechanism for correcting (moving) the positions of the limiting plates in the first direction can be simplified, and therefore it is possible to reduce the device cost and the vapor deposition cost.

It is preferable that the vapor deposition device of the present invention further includes a limiting plate tray on which the limiting plate unit is placed. In this case, it is preferable that the position adjustment mechanism moves the limiting plate tray in the first direction. With this preferred configuration, the replacement of the limiting plate unit can be easily performed in a short time.

In the above-described device, it is preferable that a positioning structure for positioning the limiting plate unit with respect to the limiting plate tray is provided on the limiting plate tray and/or the limiting plate unit. With this preferred configuration, the positional offset of the limiting plates with respect to the vapor deposition source openings due to the replacement of the limiting plate unit is unlikely to occur.

It is preferable that the limiting plate unit is divided into a plurality of unit parts in the first direction. In this case, it is preferable that the position adjustment mechanism independently moves each of the plurality of unit parts in the first direction. With this preferred configuration, the position can be more highly accurately corrected than the case where the position is corrected by moving the entire limiting plate unit in the first direction. Accordingly, the positional offset of the coating film to be formed on the substrate can be further reduced.

It is preferable that the plurality of unit parts are respectively placed on a plurality of limiting plate trays that are independent of each other. In this case, it is preferable that the position adjustment mechanism independently moves each of the plurality of limiting plate trays in the first direction. With this preferred configuration, the replacement of the unit parts can be easily performed in a short time.

Hereinafter, the present invention will be described in detail by showing preferred embodiments. It should be noted, however, that the present invention is not limited to the following embodiments. For the sake of convenience of the description, the drawings referred to hereinafter show only the principal members required to describe the present invention in simplified form among the constituent members of the embodiments of the present invention. Accordingly, the present invention may include optional constituent members that are not shown in the following drawings. Also, the dimensions of the members in the drawings do not faithfully represent the actual dimensions or dimensional proportions of the constituent members.

(Configuration of Organic EL Display Device)

An example of an organic EL display device that can be manufactured by applying the present invention will be described. This organic EL display device is a bottom emission type organic EL display device in which light is extracted from the TFT substrate side and that displays full color images by controlling light emission of red (R), green (G) and blue (B) pixels (sub-pixels).

First, the overall configuration of the organic EL display device will be described below.

Figure 2:
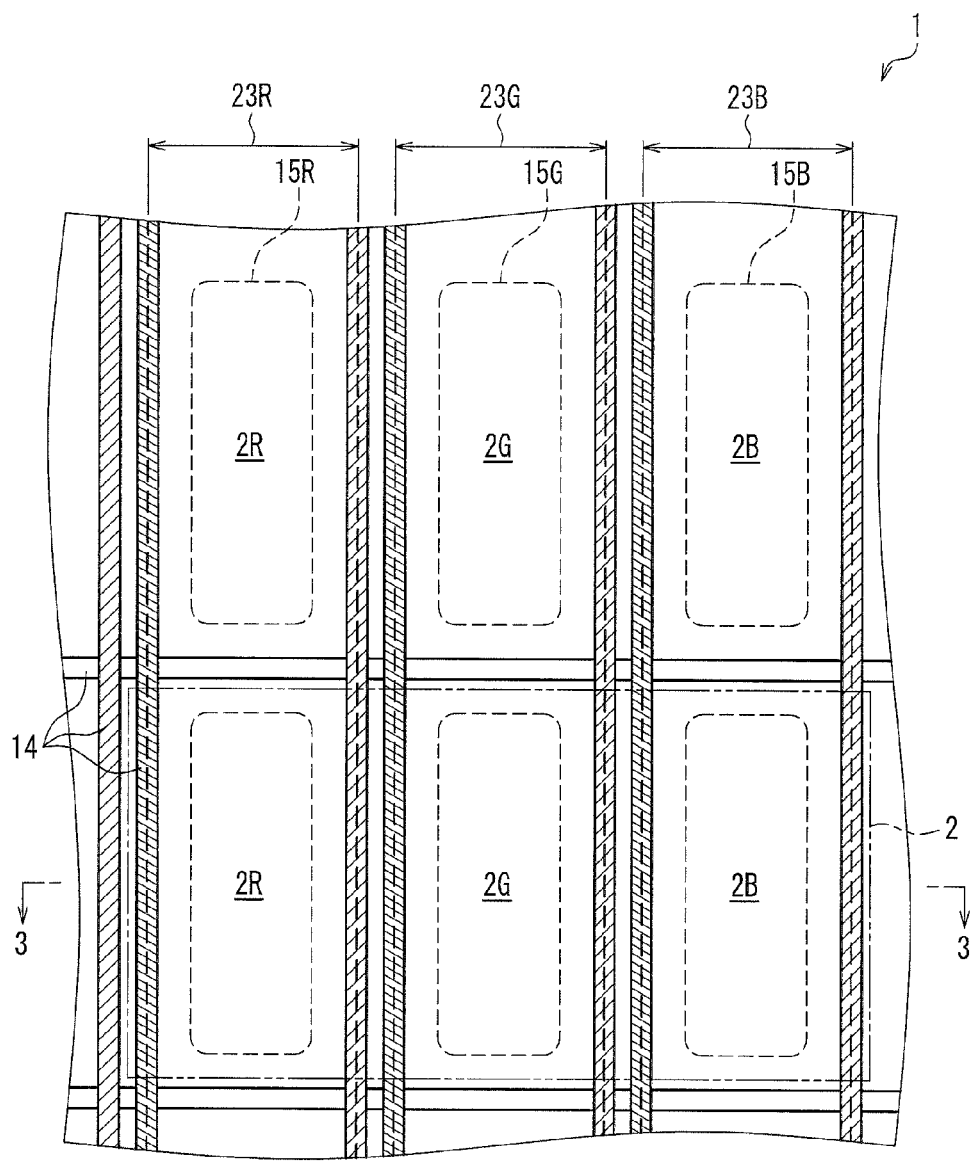
FIG. 2 is a plan view showing a configuration of pixels that constitute the organic EL display device shown in FIG. 1.
Figure 3:
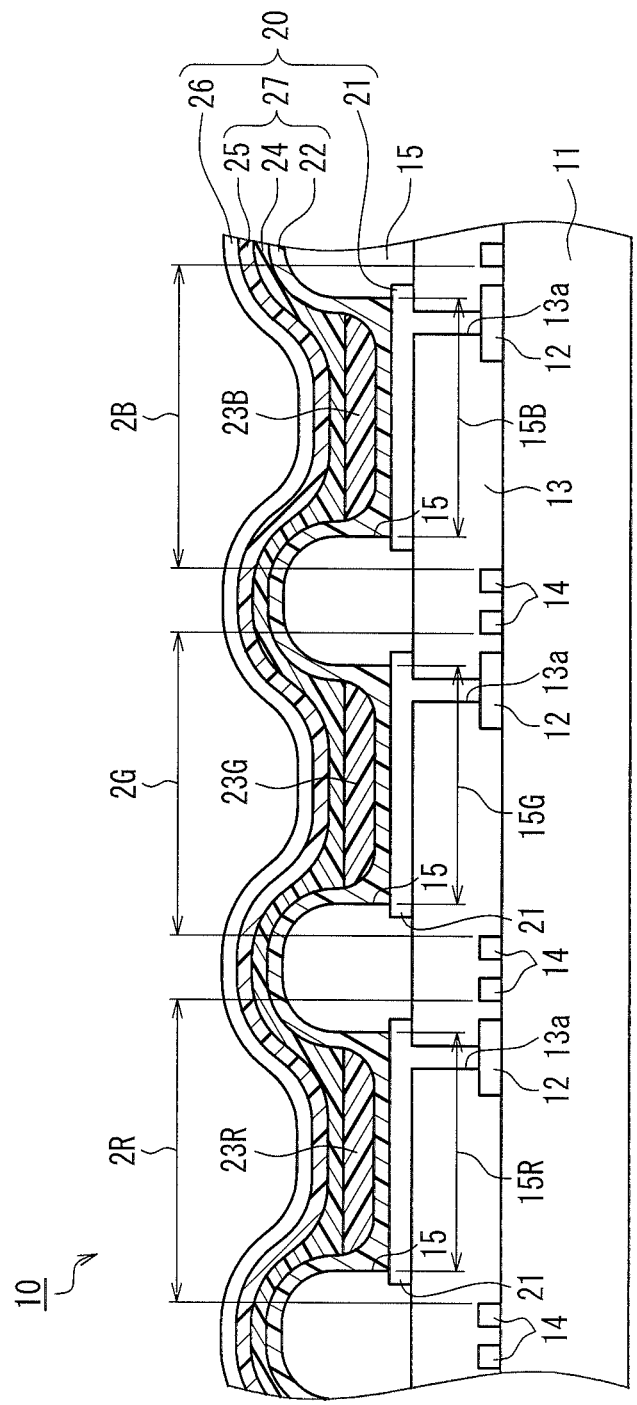
FIG. 3 is a cross-sectional view of a TFT substrate that constitutes the organic EL display device taken along the line 3-3 of FIG. 2.

FIG. 1 is a cross-sectional view showing a schematic configuration of the organic EL display device. FIG. 2 is a plan view showing a configuration of pixels that constitute the organic EL display device shown in FIG. 1. FIG. 3 is a cross-sectional view of a TFT substrate that constitutes the organic EL display device, taken along the line III-III of FIG. 2.

As shown in FIG. 1, the organic EL display device 1 has a configuration in which, on a TFT substrate 10 provided with a TFT 12 (see FIG. 3), an organic EL element 20 connected to the TFT 12, an adhesive layer 30 and a sealing substrate 40 are provided in this order. A display region 19 in which images are displayed is located in the center of the organic EL display device 1, and the organic EL element 20 is disposed within the display region 19.

The organic EL element 20 is enclosed between a pair of substrates, namely, the TFT substrate 10 and the sealing substrate 40, by the TFT substrate 10 having the organic EL element 20 laminated thereon being bonded to the sealing substrate 40 with the use of the adhesive layer 30. By the organic EL element 20 being enclosed between the TFT substrate 10 and the sealing substrate 40 as described above, oxygen and moisture are prevented from entering the organic EL element 20 from the outside.

As shown in FIG. 3, the TFT substrate 10 includes, as a support substrate, a transparent insulating substrate 11 such as a glass substrate, for example. In the case of a top emission type organic EL display device, however, the insulating substrate 11 is not necessarily transparent.

As shown in FIG. 2, on the insulating substrate 11, a plurality of wires 14 are provided that include a plurality of gate lines provided in the horizontal direction and a plurality of signal lines intersecting the gate lines and provided in the vertical direction. A gate line driving circuit (not shown) that drives the gate lines is connected to the gate lines, and a signal line driving circuit (not shown) that drives the signal lines are connected to the signal lines. On the insulating substrate 11, red (R), green (G) and blue (B) sub-pixels 2R, 2G and 2B made of the organic EL element 20 are disposed in a matrix in their respective regions surrounded by the wires 14.

The sub-pixels 2R emit red light, the sub-pixels 2G emit green light, and the sub-pixels 2B emit blue light. Sub-pixels of the same color are disposed in a column direction (up-down direction in FIG. 2) and a repeating unit consisting of sub-pixels 2R, 2G and 2B is repeatedly disposed in a row direction (right-left direction in FIG. 2). The sub-pixels 2R, 2G and 2B constituting a repeating unit in the row direction constitute a pixel 2 (specifically, a single pixel).

The sub-pixels 2R, 2G and 2B respectively include light emitting layers 23R, 23G and 23B that emit respective colors. The light emitting layers 23R, 23G and 23B are provided to extend in stripes in the column direction (up-down direction in FIG. 2).

A configuration of the TFT substrate 10 will be described. As shown in FIG. 3, the TFT substrate 10 includes, on the transparent insulating substrate 11 such as a glass substrate, the TFT 12 (switching element), the wires 14, an inter-layer film 13 (interlayer insulating film, planarized film), an edge cover 15, and so on.

The TFT 12 functions as a switching element that controls light emission of the sub-pixels 2R, 2G and 2B, and is provided for each of the sub-pixels 2R, 2G and 2B. The TFT 12 is connected to the wires 14.

The inter-layer film 13 also functions as a planarized film, and is laminated over the display region 19 of the insulating substrate 11 so as to cover the TFT 12 and the wires 14.

A first electrode 21 is formed on the inter-layer film 13. The first electrode 21 is electrically connected to the TFT 12 via a contact hole 13a formed in the inter-layer film 13.

The edge cover 15 is formed on the inter-layer film 13 so as to cover pattern ends of the first electrode 21. The edge cover 15 is an insulating layer for preventing short-circuiting between the first electrode 21 and a second electrode 26 that constitute the organic EL element 20 caused by an organic EL layer 27 becoming thin or the occurrence of electric field concentration at the pattern ends of the first electrode 21.

The edge cover 15 has openings 15R, 15G and 15B for the sub-pixels 2R, 2G and 2B. The openings 15R, 15G and 15B of the edge cover 15 serve as light emitting regions of the sub-pixels 2R, 2G and 2B. To rephrase, the sub-pixels 2R, 2G and 2B are partitioned by the edge cover 15 that is insulative. The edge cover 15 also functions as an element separation film.

The organic EL element 20 will be described.

The organic EL element 20 is a light emitting element capable of emitting highly bright light by low voltage direct current driving, and includes the first electrode 21, the organic EL layer 27 and the second electrode 26 in this order.

The first electrode 21 is a layer having a function of injecting (supplying) holes into the organic EL layer 27. As described above, the first electrode 21 is connected to the TFT 12 via the contact hole 13a.

As shown in FIG. 3, the organic EL layer 27 includes, between the first electrode 21 and the second electrode 26, a hole injection and transport layer 22, the light emitting layers 23R, 23G, 23B, an electron transport layer 24 and an electron injection layer 25 in this order from the first electrode 21 side.

In the present embodiment, the first electrode 21 serves as a positive electrode and the second electrode 26 serves as a negative electrode, but the first electrode 21 may serve as a negative electrode and the second electrode 26 may serve as a positive electrode. In this case, the order of the layers constituting the organic EL layer 27 is reversed.

The hole injection and transport layer 22 functions both as a hole injection layer and a hole transport layer. The hole injection layer is a layer having a function of enhancing the efficiency of injecting holes into the organic EL layer 27. The hole transport layer is a layer having a function of enhancing the efficiency of transporting holes to the light emitting layers 23R, 23G and 23B. The hole injection and transport layer 22 is formed uniformly over the display region 19 in the TFT substrate 10 so as to cover the first electrode 21 and the edge cover 15.

In the present embodiment, the hole injection and transport layer 22 in which a hole injection layer and a hole transport layer are integrated together is provided, but the present invention is not limited thereto, and the hole injection layer and the hole transport layer may be formed as independent layers.

On the hole injection and transport layer 22, the light emitting layers 23R, 23G and 23B are formed correspondingly to the columns of the sub-pixels 2R, 2G and 2B so as to cover the openings 15R, 15G and 15B of the edge cover 15, respectively. The light emitting layers 23R, 23G and 23B are layers having a function of emitting light by recombining holes injected from the first electrode 21 side and electrons injected from the second electrode 26 side. The light emitting layers 23R, 23G and 23B each contain a material having a high light-emission efficiency such as a low-molecular fluorescent dye or a metal complex.

The electron transport layer 24 is a layer having a function of enhancing the efficiency of transporting electrons from the second electrode 26 to the light emitting layers 23R, 23G and 23B.

The electron injection layer 25 is a layer having a function of enhancing the efficiency of injecting electrons from the second electrode 26 to the organic EL layer.

The electron transport layer 24 is formed uniformly over the display region 19 in the TFT substrate 10 such that it is on the light emitting layers 23R, 23G and 23B and the hole injection and transport layer 22 so as to cover the light emitting layers 23R, 23G and 23B and the hole injection and transport layer 22. Likewise, the electron injection layer 25 is formed uniformly over the display region 19 in the TFT substrate 10 such that it is on the electron transport layer 24 so as to cover the electron transport layer 24.

In the present embodiment, the electron transport layer 24 and the electron injection layer 25 are provided as independent layers, but the present invention is not limited thereto, and they may be provided as a single layer (specifically, an electron transport and injection layer) in which the electron transport layer 24 and the electron injection layer 25 are integrated together.

The second electrode 26 is a layer having a function of injecting electrons into the organic EL layer 27. The second electrode 26 is formed uniformly over the display region 19 in the TFT substrate 10 such that it is on the electron injection layer 25 so as to cover the electron injection layer 25.

An organic layer other than the light emitting layers 23R, 23G and 23B is not essential to the organic EL layer 27, and may be selected or omitted according to the characteristics required of the organic EL element 20. The organic EL layer 27 may further include a carrier blocking layer if necessary. By adding a hole blocking layer serving as a carrier blocking layer between the electron transport layer 24 and the light emitting layer 23R, 23G, 23B, for example, it is possible to prevent holes from escaping to the electron transport layer 24, whereby light-emission efficiency can be improved.

(Manufacturing Method for Organic EL Display Device)

A method for manufacturing an organic EL display device 1 will be described below.

Figure 4:
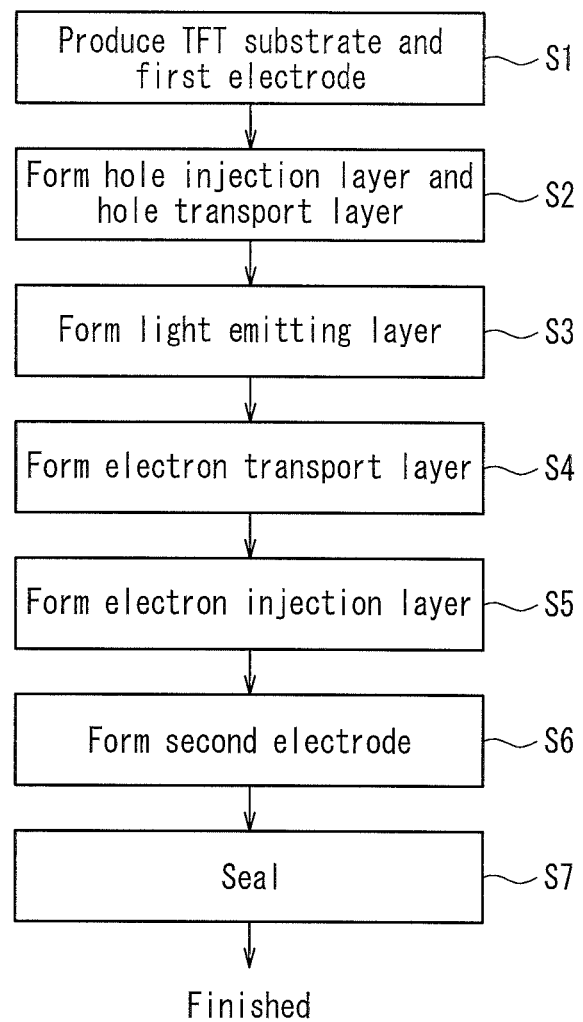
FIG. 4 is a flowchart illustrating the steps of a process for manufacturing an organic EL display device in order.

FIG. 4 is a flowchart illustrating the steps of a process for manufacturing the above-described organic EL display device 1 in order.

As shown in FIG. 4, the method for manufacturing an organic EL display device 1 according to the present embodiment includes, for example, a TFT substrate/first electrode producing step S1, a hole injection layer/hole transport layer forming step S2, a light emitting layer forming step S3, an electron transport layer forming step S4, an electron injection layer forming step S5, a second electrode forming step S6 and a sealing step S7 in this order.

Each step of FIG. 4 will be described below. It should be noted, however, that the dimensions, materials and shapes of the constituent elements described below are merely examples, and the present invention is not limited thereto. Also, in the present embodiment, the first electrode 21 is used as a positive electrode and the second electrode 26 is used as a negative electrode, but in the case where the first electrode 21 is used as a negative electrode and the second electrode 26 is used as a positive electrode, the order of the layers laminated in the organic EL layer is reversed from that discussed below. Likewise, the materials for constituting the first electrode 21 and the second electrode 26 are also reversed from those discussed below.

First, a TFT 12, wires 14 and the like are formed on an insulating substrate 11 by a known method. As the insulating substrate 11, for example, a transparent glass substrate, plastic substrate or the like can be used. As an example, a rectangular glass plate having a thickness of about 1 mm and longitudinal and transverse dimensions of 500×400 mm can be used as the insulating substrate 11.

Next, a photosensitive resin is applied onto the insulating substrate 11 so as to cover the TFT 12 and the wires 14, and patterning is performed using a photolithography technique to form an inter-layer film 13. As a material for the inter-layer film 13, for example, an insulating material such as acrylic resin or polyimide resin can be used. Generally, polyimide resin is not transparent but colored. For this reason, when manufacturing a bottom emission type organic EL display device 1 as shown FIG. 3, it is preferable to use a transparent resin such as acrylic resin for the inter-layer film 13. There is no particular limitation on the thickness of the inter-layer film 13 as long as irregularities in the upper surface of the TFT 12 can be eliminated. As an example, an inter-layer film 13 having a thickness of about 2 μm can be formed by using acrylic resin.

Next, contact holes 13a for electrically connecting the first electrode 21 to the inter-layer film 13 are formed.

Next, a first electrode 21 is formed on the inter-layer film 13. Specifically, a conductive film (electrode film) is formed on the inter-layer film 13. Next, a photoresist is applied onto the conductive film and patterning is performed by using a photolithography technique, after which the conductive film is etched using ferric chloride as an etching solution. After that, the photoresist is stripped off using a resist stripping solution, and the substrate is washed. A first electrode 21 in a matrix is thereby obtained on the inter-layer film 13.

Examples of conductive film-forming materials that can be used for the first electrode 21 include transparent conductive materials such as ITO (indium tin oxide), IZO (indium zinc oxide) and gallium-added zinc oxide (GZO); and metal materials such as gold (Au), nickel (Ni) and platinum (Pt).

As the method for laminating conductive films, it is possible to use a sputtering method, a vacuum vapor deposition method, a CVD (chemical vapor deposition) method, a plasma CVD method, a printing method or the like can be used.

As an example, a first electrode 21 having a thickness of about 100 nm can be formed by a sputtering method using ITO.

Next, an edge cover 15 having a predetermined pattern is formed. The edge cover 15 can be formed by, for example, patterning performed in the same manner as performed for the inter-layer film 13, using the same insulating materials as those listed for the edge cover 15. As an example, an edge cover 15 having a thickness of about 1 μm can be formed using acrylic resin.

Through the above processing, the TFT substrate 10 and the first electrode 21 are produced (Step S1).

Next, the TFT substrate 10 that has undergone step S1 is baked under reduced pressure for the purpose of dehydration and then subjected to an oxygen plasma treatment in order to wash the surface of the first electrode 21.

Next, on the TFT substrate 10, a hole injection layer and a hole transport layer (in the present embodiment, a hole injection and transport layer 22) is formed over the display region 19 in the TFT substrate 10 by a vapor deposition method (S2).

Specifically, an open mask having an opening corresponding to the entire display region 19 is closely fixed to the TFT substrate 10. Materials for forming a hole injection layer and a hole transport layer are deposited over the display region 19 in the TFT substrate 10 through the opening of the open mask while the TFT substrate 10 and the open mask are rotated together.

As noted above, the hole injection layer and the hole transport layer may be integrated into a single layer, or may be independent layers. Each layer has a thickness of, for example, 10 to 100 nm.

Examples of materials for the hole injection layer and the hole transport layer include benzine, styryl amine, triphenyl amine, porphyrin, triazole, imidazole, oxadiazole, polyarylalkane, phenylene diamine, arylamine, oxazole, anthracene, fluorenone, hydrazone, stilbene, triphenylene, azatriphenylene and derivatives thereof, heterocyclic or linear conjugated monomers, oligomers or polymers, such as polysilane-based compounds, vinylcarbazole-based compounds, thiophene-based compounds, aniline-based compounds and the like.

As an example, a hole injection and transport layer 22 having a thickness of 30 nm can be formed using 4,4'-bis[N-(1-naphthyl)-N-phenylamino]biphenyl (α-NPD).

Next, on the hole injection and transport layer 22, light emitting layers 23R, 23G and 23B are formed in stripes so as to cover openings 15R, 15G and 15B in the edge cover 15 (S3). The light emitting layers 23R, 23G and 23B are deposited such that respective colors, namely, red, green and blue are applied to corresponding predetermined regions (vapor deposition by color).

As materials for the light emitting layers 23R, 23G and 23B, materials having a high light-emission efficiency such as low-molecular fluorescent dyes or metal complexes can be used. Examples thereof include anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene and derivatives thereof, tris(8-quinolinolato)aluminum complex, bis(benzoquinolinato) beryllium complex, tri(dibenzoylmethyl)phenanthroline europium complex, ditolyl vinyl biphenyl and the like.

The light emitting layers 23R, 23G and 23B can have a thickness of, for example, 10 to 100 nm.

The vapor deposition method and the deposition device of the present invention can be used particularly suitably in vapor deposition by color for forming light emitting layers 23R, 23G and 23B. The method for forming light emitting layers 23R, 23G and 23B using the present invention will be described later in detail.

Next, an electron transport layer 24 is formed over the display region 19 in the TFT substrate 10 so as to cover the hole injection and transport layer 22 and the light emitting layers 23R, 23G and 23B by a vapor deposition method (S4). The electron transport layer 24 can be formed in the same manner as in the hole injection layer/hole transport layer forming step (S2) described above.

Next, an electron injection layer 25 is formed over the display region 19 in the TFT substrate 10 so as to cover the electron transport layer 24 by a vapor deposition method (S5). The electron injection layer 25 can be formed in the same manner as in the hole injection layer/hole transport layer forming step (S2) described above.

Examples of materials for the electron transport layer 24 and the electron injection layer 25 include quinoline, perylene, phenanthroline, bisstyryl, pyrazine, triazole, oxazole, oxadiazole, fluorenone, and derivatives and metal complexes thereof, LiF (lithium fluoride) and the like.

As noted above, the electron transport layer 24 and the electron injection layer 25 may be formed as a single layer in which these layers are integrated together, or may be formed as independent layers. Each layer has a thickness of, for example, 1 to 100 nm. The total thickness of the electron transport layer 24 and the electron injection layer 25 is, for example, 20 to 200 nm.

As an example, an electron transport layer 24 having a thickness of 30 nm can be formed using Alq (tris(8-hydroxyquinoline)aluminum), and an electron injection layer 25 having a thickness of 1 nm can be formed using LiF (lithium fluoride).

Next, a second electrode 26 is formed over the display region 19 in the TFT substrate 10 so as to cover the electron injection layer 25 by a vapor deposition method (S6). The second electrode 26 can be formed in the same manner as in the hole injection layer/hole transport layer forming step (S2) described above. The material (electrode material) for the second electrode 26 is preferably a metal having a small work function, or the like. Examples of such electrode materials include magnesium alloy (MgAg and the like), aluminum alloy (AlLi, AICa, AlMg and the like), metal calcium, and the like. The second electrode 26 has a thickness of, for example, 50 to 100 nm. As an example, a second electrode 26 having a thickness of 50 nm can be formed using aluminum.

On the second electrode 26, a protective film may be formed so as to cover the second electrode 26, in order to prevent oxygen and moisture from entering the organic EL element 20 from the outside. As the material for the protective film, an insulating or conductive material can be used. Examples thereof include silicon nitride and silicon oxide. The protective film has a thickness of, for example, 100 to 1000 nm.

Through the above processing, the organic EL element 20 including the first electrode 21, the organic EL layer 27 and the second electrode 26 can be formed on the TFT substrate 10.

Next, as shown in FIG. 1, the TFT substrate 10 having the organic EL element 20 formed thereon is bonded to a sealing substrate 40 by using an adhesive layer 30 so as to enclose the organic EL element 20. As the sealing substrate 40, for example, an insulating substrate, such as a glass substrate or a plastic substrate, having a thickness of 0.4 to 1.1 mm can be used.

In this manner, an organic EL display device 1 is obtained.

In the organic EL display device 1, when the TFT 12 is turned on by input of signals from the wires 14, holes are injected from the first electrode 21 into the organic EL layer 27. On the other hand, electrons are injected from the second electrode 26 into the organic EL layer 27. The holes and the electrons are recombined in the light emitting layers 23R, 23G and 23B and emit predetermined color light when deactivating energy. By controlling emitting brightness of each of the sub-pixels 2R, 2G and 2B, a predetermined image can be displayed on the display region 19.

Hereinafter, S3, which is the step of forming light emitting layers 23R, 23G and 23B by vapor deposition by color, will be described.

(New Vapor Deposition Method)

The present inventors investigated, as the method for forming light emitting layers 23R, 23G and 23B by vapor deposition by color, a new vapor deposition method (hereinafter referred to as the "new vapor deposition method") in which vapor deposition is performed while a substrate is moved with respect to a vapor deposition source and a vapor deposition mask, instead of the vapor deposition method as disclosed in Patent Documents 1 and 2 in which a mask having the same size as a substrate is fixed to the substrate at the time of vapor deposition.

Figure 5:
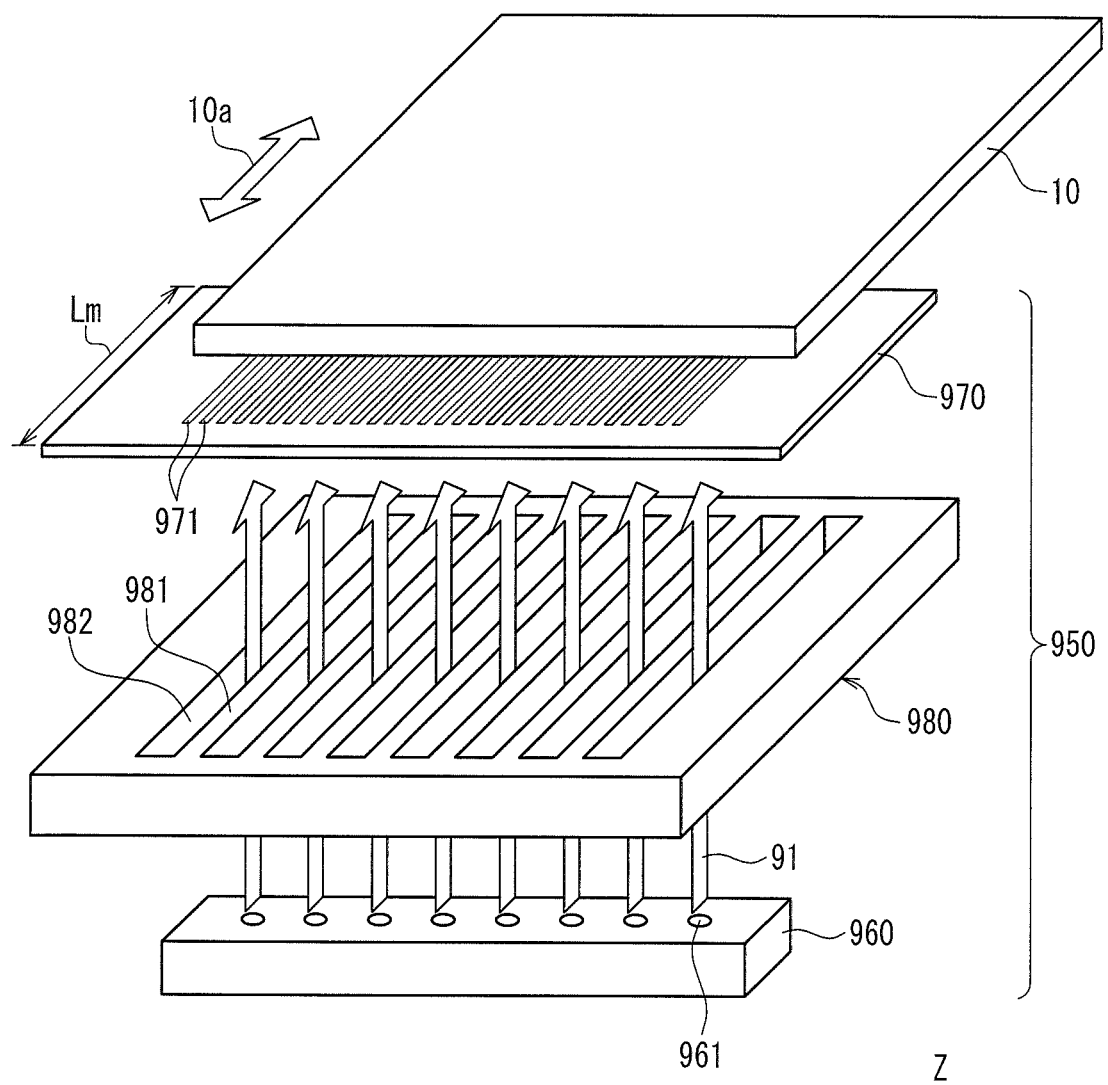
FIG. 5 is a perspective view showing the basic configuration of a vapor deposition device according to a new vapor deposition method.
Figure 6:
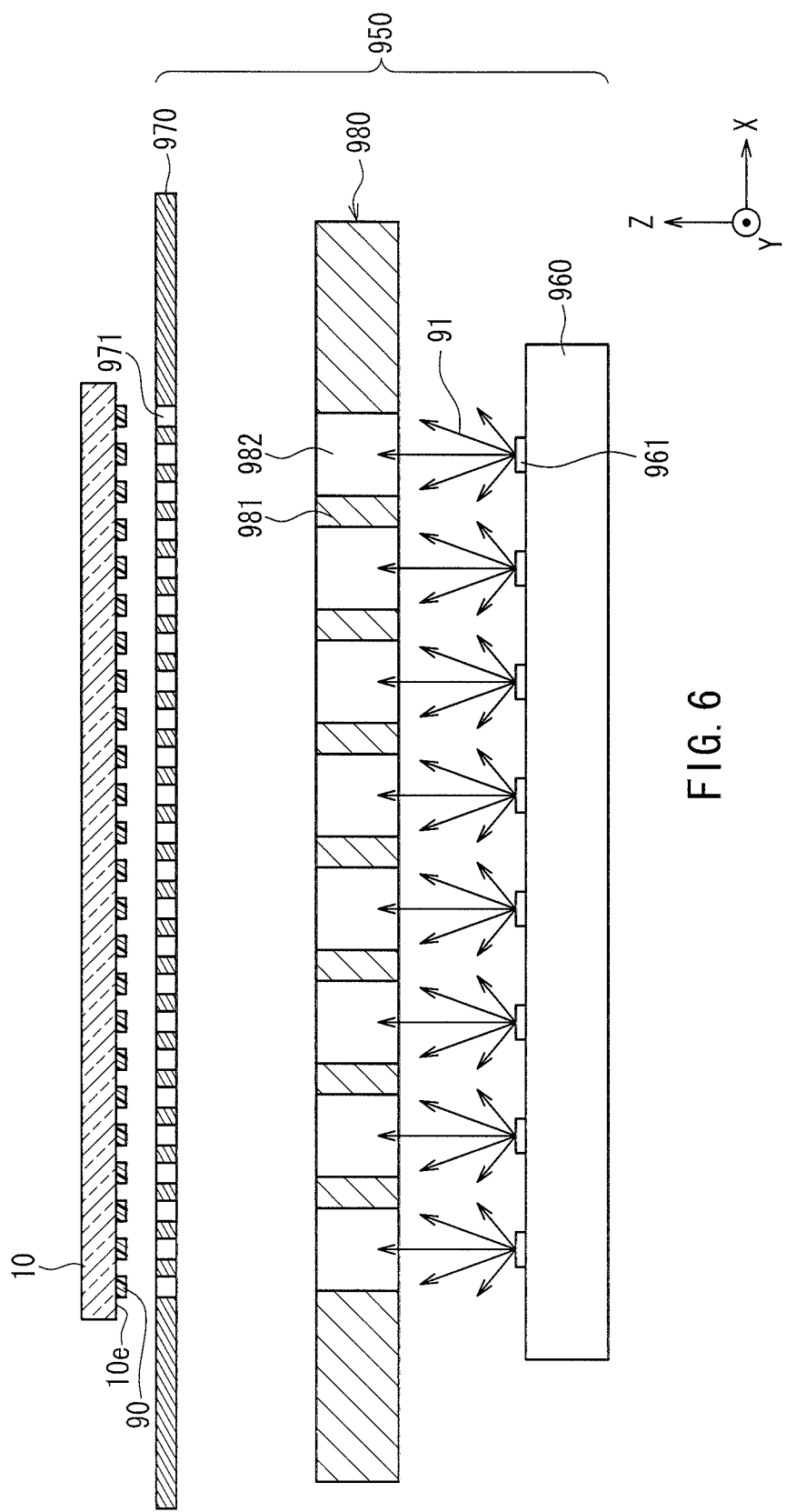
FIG. 6 is a front cross-sectional view of the vapor deposition device shown in FIG. 5 as viewed in a direction parallel to the traveling direction of a substrate.

FIG. 5 is a perspective view showing the basic configuration of the vapor deposition device according to the new vapor deposition method. FIG. 6 is a front cross-sectional view of the vapor deposition device shown in FIG. 5.

A vapor deposition source 960, a vapor deposition mask 970, and a limiting plate unit 980 disposed therebetween constitute a vapor deposition unit 950. The relative positions of the vapor deposition source 960, the limiting plate unit 980, and the vapor deposition mask 970 are constant. The substrate 10 moves along an arrow 10a at a constant speed with respect to the vapor deposition mask 970 on the opposite side from the vapor deposition source 960. For the sake of convenience of the description given below, an XYZ orthogonal coordinate system is set in which a horizontal axis parallel to the movement direction 10a of the substrate 10 is defined as the Y axis, a horizontal axis perpendicular to the Y axis is defined as the X axis, and a vertical axis perpendicular to the X axis and the Y axis is defined as the Z axis. The Z axis is parallel to the normal line direction of the deposition surface 10e of the substrate 10.

A plurality of vapor deposition source openings 961 that discharge vapor deposition particles 91 are formed on the upper surface of the vapor deposition source 960. The plurality of vapor deposition source openings 961 are arranged at a fixed pitch along a straight line parallel to the X axis.

The limiting plate unit 980 has a plurality of limiting plates 981. The major surface (the surface having the largest area) of each of the limiting plates 981 is parallel to the YZ plane. The plurality of limiting plates 981 are arranged parallel to the direction in which the plurality of vapor deposition source openings 961 are arranged (that is, the X axis direction), at a fixed pitch. A space between limiting plates 981 neighboring in the X axis direction that penetrates the limiting plate unit 980 in the Z axis direction is referred to as a limiting space 982.

A plurality of mask openings 971 are formed in the vapor deposition mask 970. The plurality of mask openings 971 are arranged along the X axis direction.

The vapor deposition particles 91 discharged from the vapor deposition source openings 961 pass through the limiting spaces 982, further pass through the mask openings 971, and adhere to the substrate 10 to form a stripe-shaped coating film 90 parallel to the Y axis. Vapor deposition is repeatedly performed for each color of light emitting layers 23R, 23G and 23B, whereby vapor deposition by color for forming light emitting layers 23R, 23G and 23B can be performed.

According to this new vapor deposition method, a dimension Lm of the vapor deposition mask 970 in the movement direction 10a of the substrate 10 can be set irrespective of a dimension of the substrate 10 in the same direction. This enables the use of a vapor deposition mask 970 that is smaller than the substrate 10. Accordingly, even if the substrate 10 is made large, the vapor deposition mask 970 does not need to be made large, and therefore the problem in that the vapor deposition mask 970 is bent by its own weight or being extended does not occur. Also, the vapor deposition mask 970 and a frame or the like for holding the vapor deposition mask 970 do not need to be made big and heavy. Accordingly, the problems encountered with the conventional vapor deposition methods disclosed in Patent Documents 1 and 2 are solved, and large-sized substrates can be subjected to vapor deposition by color.

Effects of the new vapor deposition method on the limiting plate unit 980 are now described.

Figure 7:
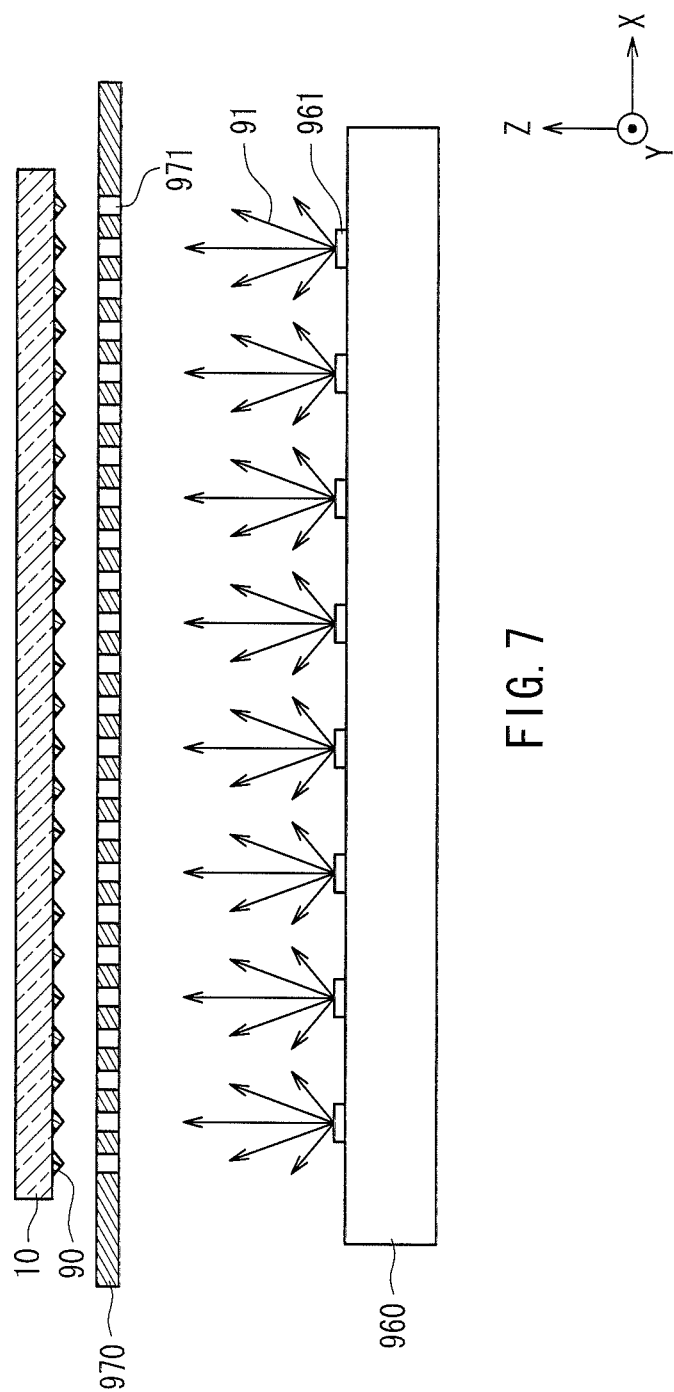
FIG. 7 is a front cross-sectional view of the vapor deposition device shown in FIG. 5 without a limiting plate unit.

FIG. 7 is a cross-sectional view showing the vapor deposition device according to the new vapor deposition method similar to FIG. 6 except that the limiting plate unit 980 is omitted.

As shown in FIG. 7, the vapor deposition particles 91 from each vapor deposition source opening 961 are discharged with a certain spread (directivity). Specifically, in FIG. 7, the number of vapor deposition particles 91 discharged from each vapor deposition source opening 961 is the greatest in a direction upward from the vapor deposition source opening 961 (the Z axis direction) and gradually decreases as the angle (departure angle) formed with respect to the straight upward direction increases. The vapor deposition particles 91 discharged from the vapor deposition source openings 961 travel straight in their discharged directions. In FIG. 7, the flow of vapor deposition particles 91 discharged from the vapor deposition source openings 961 is conceptually indicated by arrows. The length of the arrows corresponds to the number of vapor deposition particles. Accordingly, each mask opening 971 mostly receives, but not necessarily limited thereto, the vapor deposition particles 91 discharged from the vapor deposition source opening 961 located directly below the mask opening 971 and also receives the vapor deposition particles 91 discharged from the vapor deposition source openings 961 located obliquely downward.

Figure 8:
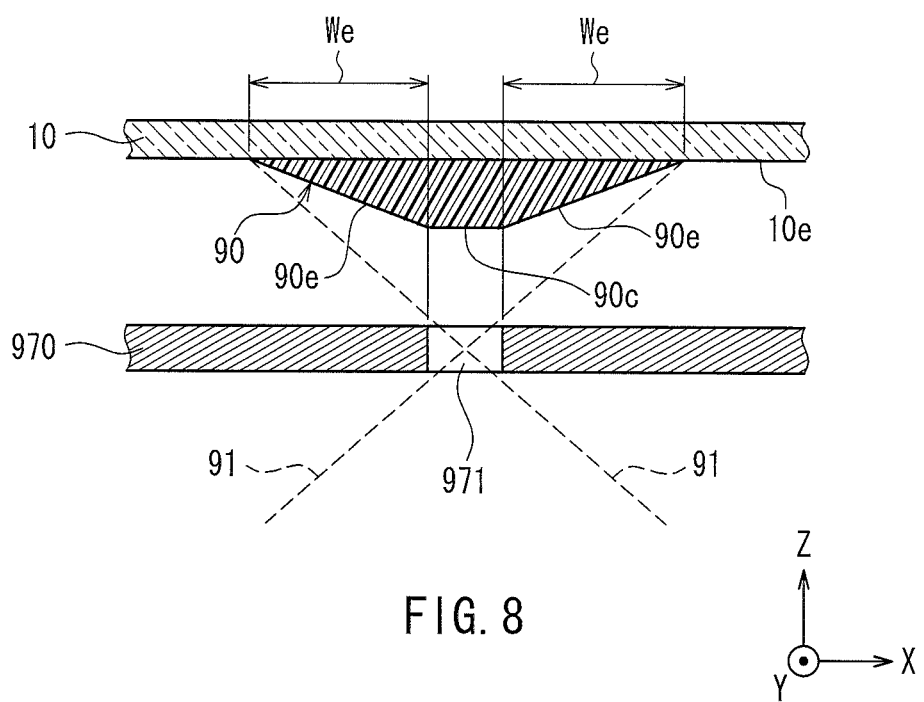
FIG. 8 is a cross-sectional view illustrating the cause of blur generated at both edges of a coating film.

FIG. 8 is a cross-sectional view of a coating film 90 formed on a substrate 10 with vapor deposition particles 91 that have passed through a mask opening 971 in the vapor deposition device of FIG. 7, as viewed in a plane perpendicular to the Y axis as in FIG. 7. As described above, the vapor deposition particles 91 coming from various directions pass through the mask opening 971. The number of vapor deposition particles 91 that reach a deposition surface 10e of the substrate 10 is the greatest in a region directly above the mask opening 971 and gradually decreases as the position gets farther away therefrom. Accordingly, as shown in FIG. 8, on the deposition surface 10e of the substrate 10, a coating film main portion 90c having a large and substantially constant thickness is formed in the region where the mask opening 971 is projected onto the substrate 10 from directly above, and blur portions 90e that are gradually thinner as the position gets farther away from the coating film main portion 90c are formed on both sides of the coating film main portion 90c. Then, the blur portions 90e cause blur at the edge of the coating film 90.

In order to reduce the width We of the blur portion 90e, a space between the vapor deposition mask 970 and the substrate 10 needs only be reduced. However, because it is necessary to move the substrate 10 relative to the vapor deposition mask 970, it is not possible to reduce the space between the vapor deposition mask 970 and the substrate 10 to zero.

If the blur portion 90e extends to the neighboring light emitting layer region having a different color due to an increase in the width We of the blur portion 90e, it causes "color mixing" or degradation of the characteristics of the organic EL element. In order to prevent the blur portion 90e from extending to the neighboring light emitting layer region having a different color, so as to not cause color mixing, it is necessary to reduce the opening width of pixels (the pixels referring to the sub-pixels 2R, 2G and 2B shown in FIG. 2) or to increase the pixel pitch so as to increase the non-light-emitting region. However, if the opening width of the pixels is reduced, the light-emitting region will be small, causing a reduction in brightness. If the current density is increased in order to obtain the required brightness, the organic EL element will have a short service life and easily be damaged, causing a reduction in reliability. If, on the other hand, the pixel pitch is increased, display of high definition images cannot be achieved, reducing the quality of display.

In contrast, with a new vapor deposition method, as shown in FIG. 6, the limiting plate unit 980 is provided between the vapor deposition source 960 and the vapor deposition mask 970. Among the vapor deposition particles 91 discharged from each vapor deposition source opening 961 with a certain spread (directivity), those having a large speed vector component in the X axis direction collide with and adhere to the limiting plates 981 and therefore cannot pass through limiting spaces 982 and cannot reach the mask openings 971. That is, the limiting plates 981 limit the incidence angle of the vapor deposition particles 91 entering the mask openings 971. As used herein, "incidence angle" of the vapor deposition particles 91 with respect to a mask opening 971 is defined as the angle formed between the flight direction of the vapor deposition particles 91 entering the mask opening 971 and the Z axis on a projection onto the XZ plane.

As described above, the directivity of the vapor deposition particles 91 in the X axis direction can be improved by using the limiting plate unit 980 including the plurality of limiting plates 981. Accordingly, the width We of the blur portion 90e can be reduced.

With the above-described conventional vapor deposition method described in Patent Document 3, a member corresponding to the limiting plate unit 980 of the new vapor deposition method is not used. Also, vapor deposition particles are discharged from a single slot-shaped opening of the vapor deposition source that extends along the direction orthogonal to the relative movement direction of the substrate. With this configuration, the incidence angle of the vapor deposition particles with respect to the mask opening becomes larger than that in the new vapor deposition method, and therefore detrimental blur occurs at the edge of the coating film.

As described above, according to the new vapor deposition method, the width We of the blur portion 90e at the edge of the coating film 90 to be formed on the substrate 10 can be reduced. Therefore, vapor deposition by color for forming light emitting layers 23R, 23G and 23B using the new vapor deposition method can prevent color mixing from occurring. Accordingly, the pixel pitch can be reduced, and in this case, it is possible to provide an organic EL display device that is capable of displaying high definition images. Meanwhile, the light-emitting region may be enlarged without changing the pixel pitch, and in this case, it is possible to provide an organic EL display device that is capable of displaying high definition images. Also, because it is not necessary to increase the current density in order to increase the brightness, the organic EL element does not have a short service life and is not easily damaged, and a reduction in reliability can be prevented.

However, as a result of examinations, the present inventors found that the new vapor deposition method is problematic in that if the coating film 90 is formed on the substrate 10 actually using the new method, the coating film 90 is not formed at a desired position. Furthermore, they found that this problem is caused by the relative positional offset in the X axis direction between the vapor deposition source openings 961 and the limiting plates 981.

This will be described below.

Figure 9A:
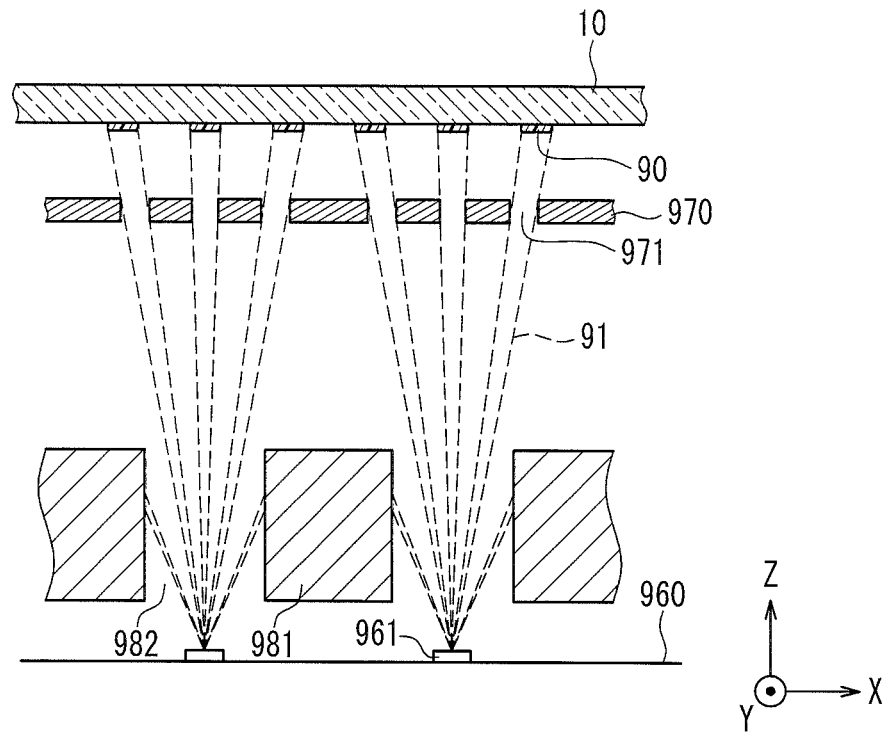
FIG. 9A is a cross-sectional view showing the coating film formed on a substrate in an ideal state in the new vapor deposition method.

FIG. 9A is a cross-sectional view showing the coating film 90 formed on the substrate 10 in an ideal state in which relative positional offset does not occur between the vapor deposition source opening 961 and the limiting plates 981. In the present example, one vapor deposition source opening 961 is disposed for one limiting space 982, and the vapor deposition source opening 961 is disposed at the central position of a pair of the limiting plates 981 in the X axis direction. Among the vapor deposition particles 91 discharged from the vapor deposition source opening 961, the vapor deposition particles 91 that pass through the limiting space 982 directly above the vapor deposition source opening 961 and then pass through the mask opening 971 adhere to the substrate 10 so as to form the coating film 90.

Figure 9B:
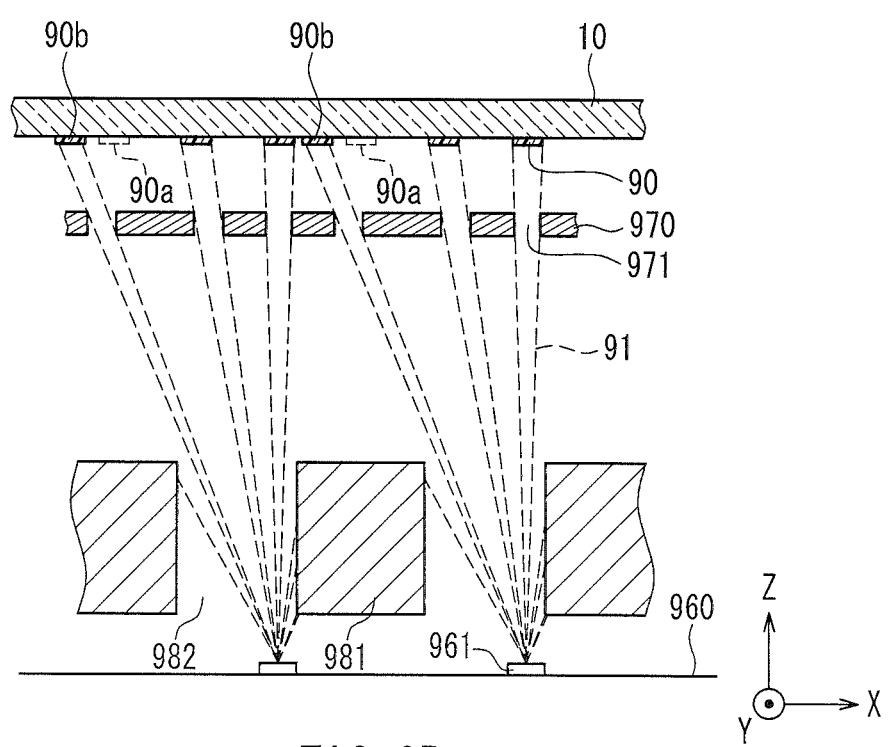
FIG. 9B is a cross-sectional view showing the coating film formed on a substrate in a state in which a relative positional offset occurs between vapor deposition source openings and limiting plates in the new vapor deposition method.

FIG. 9B is a cross-sectional view showing the coating film 90 formed on the substrate 10 in a state in which a relative positional offset in the X axis direction occurs between the vapor deposition source openings 961 and the limiting plates 981. In the present example, the limiting plates 981 are positionally offset to the left in FIG. 9B with respect to the vapor deposition source openings 961. The coating film 90a that was formed in FIG. 9A is not formed due to the limiting plates 981 being positionally offset relative to the vapor deposition source openings 961 and the vapor deposition mask 970, and the coating film 90b is formed at an undesired position. In other words, the position of the coating film 90a is positionally offset to the position of the coating film 90b.

With the new vapor deposition method, as shown in FIG. 9B, the problem in that the coating film 90 is not formed at the desired position occurs because the vapor deposition source opening 961 that discharges the vapor deposition particles 91 incident on each mask opening 971 is selected by the limiting plate 981.

The above-described relative positional offset in the X axis direction between the vapor deposition source openings 961 and the limiting plates 981 may occur in the case where the limiting plate unit 980 is replaced, for example. As described above, because vapor deposition particles that have a large speed vector component in the X axis direction are captured by the limiting plates 981, a vapor deposition material is deposited on the surface of the limiting plates 981 as time elapses. If the vapor deposition material deposited on the limiting plates 981 comes off, falls on the vapor deposition source 960, and evaporates again, the vapor deposition particles adhere to the substrate 10 at undesired positions. Also, if the vapor deposition material deposited on the limiting plates 981 falls on the vapor deposition source openings 961, the vapor deposition source openings 961 are blocked and the coating film is not be formed at a desired position on the substrate 10. Furthermore, if the deposition thickness of the vapor deposition material is increased, the distance of the limiting space 982 in the X axis direction is decreased, and therefore the function of the limiting plates 981 for desirably selecting the vapor deposition particles 91 does not work. Therefore, it is inevitable to replace the limiting plate unit 980 to which the vapor deposition material adhere by a new one in the new vapor deposition method. When a new limiting plate unit 980 is attached, the positional offset of the limiting plates 981 with respect to the vapor deposition source openings 961 may occur.

Also, the relative positional offset in the X axis direction between the vapor deposition source openings 961 and the limiting plates 981 may occur due to respective thermal expansions of the vapor deposition source 960 and the limiting plate unit 980. In order to discharge the vapor deposition material that is vaporized from the vapor deposition source openings 961 as the vapor deposition particles 91, it is necessary to maintain the vapor deposition source 960 at a high temperature, and therefore the thermal expansion thereof cannot be avoided. Also, the limiting plate unit 980 also is heated by radiant heat from the vapor deposition source 960 and is thermally expanded. Furthermore, because the vapor deposition source 960 and the limiting plate unit 980 are made of different materials, they have different linear expansion coefficients. As a result, the positional offset of the limiting plates 981 with respect to the vapor deposition source openings 961 may occur.

Furthermore, in the case where the size of the device is increased, the vapor deposition source 960 is heated to a higher temperature, or the device is continuously operated for a long period, the relative positional offset between the vapor deposition source openings 961 and the limiting plates 981 becomes more noticeable.

In other words, if the size of the device is increased, the amount of thermal expansion also is increased, and therefore the relative positional offset between the vapor deposition source openings 961 and the limiting plates 981 becomes large particularly at the ends in the X axis direction.

Also, in the case where the speed for forming the film is increased to improve throughput at the time of mass production, it is necessary to increase the temperature of the vapor deposition source 960, and therefore the amount of thermal expansion is increased and the relative positional offset between the vapor deposition source openings 961 and the limiting plates 981 is increased.

Furthermore, in the case where the device is continuously operated for a long period, the temperatures of the vapor deposition source 960 and the limiting plate unit 980 are repeatedly increased or decreased and the number of replacements of the limiting plate unit 980 is increased, and therefore the relative positional offset between the vapor deposition source openings 961 and the limiting plates 981 is increased.

The present inventors conducted an in-depth investigation to solve the above problems encountered with the new vapor deposition method and the present invention has been accomplished. Hereinafter, the present invention will be described using preferred embodiments.

Embodiment 1

Figure 10:
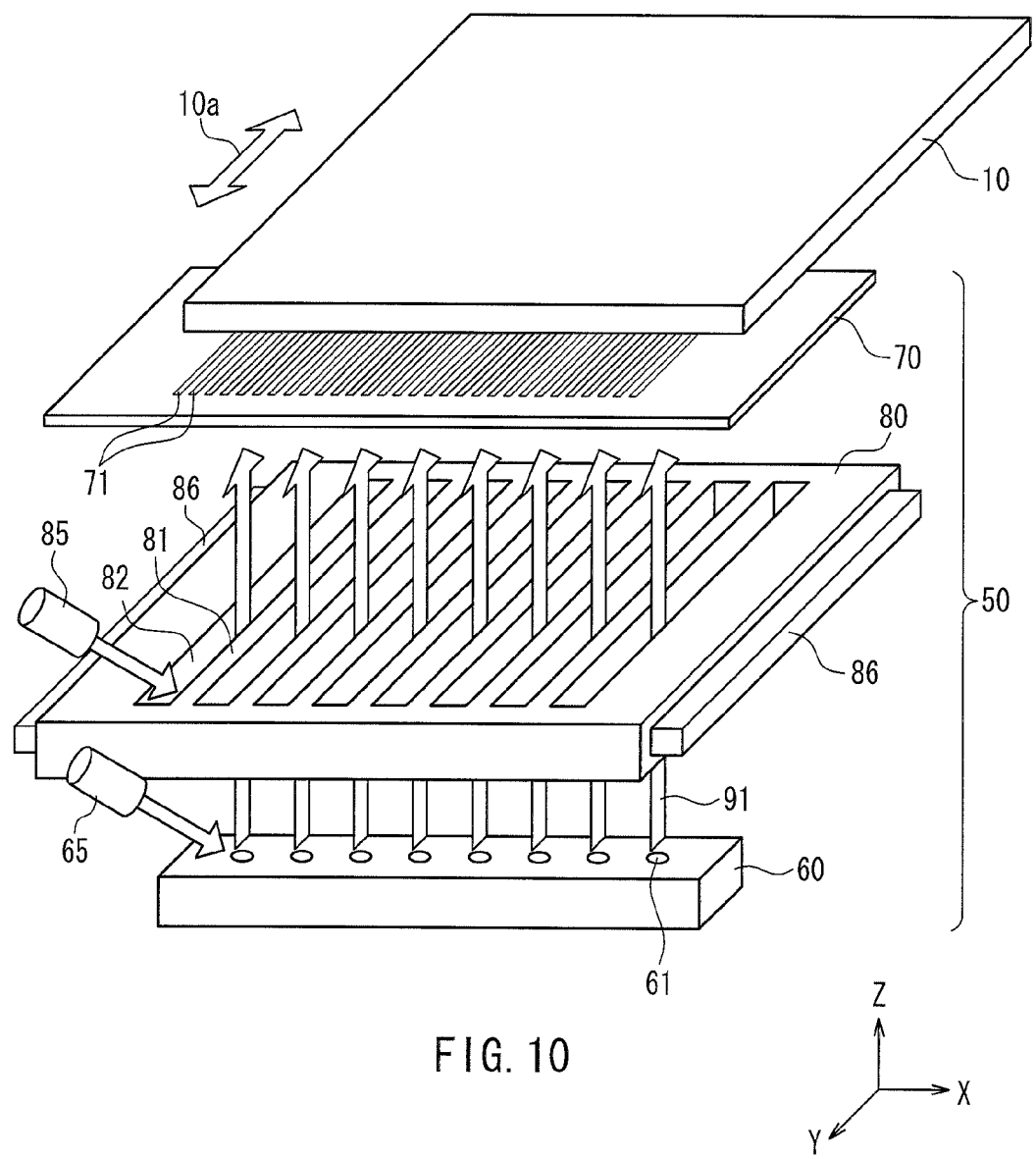
FIG. 10 is a perspective view showing the basic configuration of a vapor deposition device according to Embodiment 1 of the present invention.
Figure 11:
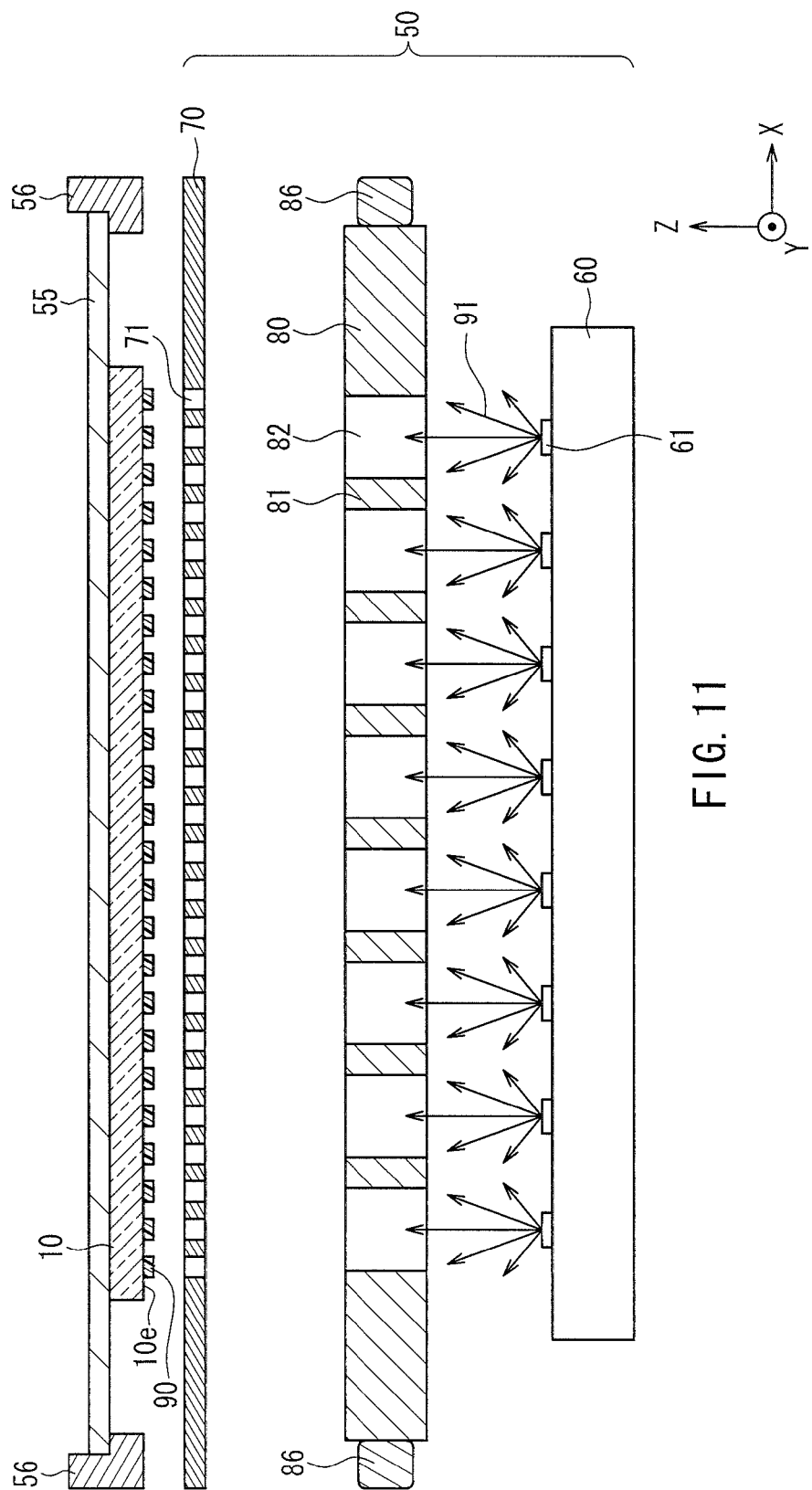
FIG. 11 is a front cross-sectional view of the vapor deposition device shown in FIG. 10 as viewed in a direction parallel to the traveling direction of a substrate.

FIG. 10 is a perspective view showing the basic configuration of a vapor deposition device according to Embodiment 1 of the present invention. FIG. 11 is a front cross-sectional view of the vapor deposition device shown in FIG. 10.

A vapor deposition source 60, a vapor deposition mask 70, and a limiting plate unit 80 disposed therebetween constitute a vapor deposition unit 50. The substrate 10 moves along an arrow 10*a* at a constant speed with respect to the vapor deposition mask 70 on the opposite side from the vapor deposition source 60. For the sake of convenience of the description given below, an XYZ orthogonal coordinate system is set in which a horizontal axis parallel to the movement direction 10*a* of the substrate 10 is defined as the Y axis, a horizontal axis perpendicular to the Y axis is defined as the X axis, and a vertical axis perpendicular to the X axis and the Y axis is defined as the Z axis. The Z axis is parallel to the normal line direction of the deposition surface 10*e* of the substrate 10. To facilitate the description, the side to which the arrow indicating the Z axis points (the upper side of FIG. 11) is referred to the "upper side".

The vapor deposition source 60 has a plurality of vapor deposition source openings 61 in its upper surface (the surface facing the vapor deposition mask 70). The plurality of vapor deposition source openings 61 are arranged at a fixed pitch along a straight line parallel to the X axis direction. Each vapor deposition source opening 61 has a nozzle shape that is upwardly open parallel to the Z axis and discharges vapor deposition particles 91, which are a light emitting layer-forming material, toward the vapor deposition mask 70.

The vapor deposition mask 70 is a plate-shaped piece that has a major surface (the surface having the largest area) parallel to the XY plane and in which a plurality of mask openings 71 are formed along the X axis direction at different positions in the X axis direction. The mask openings 71 are through holes that penetrate the vapor deposition mask 70 in the Z axis direction. In the present embodiment, each mask opening 71 has an opening shape having a slot shape that is parallel to the Y axis, but the present invention is not limited thereto. All of the mask openings 71 may have the same shape and dimensions, or may have different shapes and dimensions. The pitch in the X axis direction of the mask openings 71 may be constant or different.

It is preferable that vapor deposition mask 70 is held by a mask tension mechanism (not shown). The mask tension mechanism prevents the occurrence of bending or extension of the vapor deposition mask 70 due to its own weight, by applying tension to the vapor deposition mask 70 in a direction parallel to the major surface thereof.

The limiting plate unit 80 is disposed between the vapor deposition source openings 61 and the vapor deposition mask 70. The limiting plate unit 80 includes a plurality of limiting plates 81 arranged at a constant pitch along the X axis direction. It is preferable that the plurality of limiting plates 81 are thin plates having the same dimension, and each of the limiting plates has the major surface parallel to the Y axis and the Z axis. The space between the limiting plates 81 neighboring in the X axis direction is a limiting space 82 through which the vapor deposition particles 91 pass.

In the present embodiment, one vapor deposition source opening 61 is disposed at the center of limiting plates 81 neighboring in the X axis direction. Accordingly, one vapor deposition source opening 61 corresponds to one limiting space 82. However, the present invention is not limited to this, and the plurality of limiting spaces 82 may be configured to correspond to one vapor deposition source opening 61, or one limiting space 82 may be configured to correspond to the plurality of vapor deposition source openings 61. In the present invention, "the limiting space 82 corresponding to the vapor deposition source opening 61" refers to the limiting space 82 that is designed to allow the passage of the vapor deposition particles 91 discharged from the vapor deposition source opening 61.

In FIGS. 10 and 11, although the number of vapor deposition source openings 61 and the number of limiting spaces 82 are eight, the present invention is not limited to this and the number may be larger or smaller than this.

In the present embodiment, the limiting plate unit 80 is formed into a substantially rectangular parallelepiped object (or thick plate-like object) by forming rectangular parallelepiped through holes penetrating in the Z axis direction at a constant pitch in the X axis direction. Each through hole serves as the limiting space 82, and each wall between neighboring through holes serves as the limiting plate 81. However, the method for manufacturing the limiting plate unit 80 is not limited thereto. For example, the plurality of limiting plates 81 having the same dimension may be made separately and fixed to a holding body at a constant pitch by means of welding or the like.

A cooling device for cooling the limiting plates 81, or a temperature adjustment device for maintaining the limiting plates 81 at a fixed temperature may be provided on the limiting plate unit 80.

Reference numeral 86 denotes a position adjustment mechanism for adjusting (correcting) the position of the limiting plate unit 80 in the X axis direction. The position adjustment mechanism 86 may be a screw mechanism that is capable of manually moving the limiting plate unit 80 in the X axis direction, for example, or may be a motor-driven mechanism that includes a known actuator such as a motor or the like and that is controlled by electric signals.

Reference numeral 85 denotes a limiting plate sensor that measures the position of the limiting plate 81 (in particular, the position in the X axis direction). Reference numeral 65 denotes a vapor deposition source sensor that measures the position of the vapor deposition source opening 61 (in particular, the position in the X axis direction). It is preferable that the limiting plate sensor 85 and the vapor deposition source sensor 65 can measure the positions of the limiting plate 81 and the vapor deposition source opening 61 without making contact, and can be configured by an infrared monitor, a CCD monitor, or the like, for example.

It is preferable to measure the positions of the limiting plates 81 and the vapor deposition source openings 61 at at least one end in the X axis direction among the plurality of limiting plates 81 and the plurality of vapor deposition source openings 61 arranged in the X axis direction, more preferable to measure the positions of the limiting plate 81 and the vapor deposition source opening 61 at both ends in the X axis direction, and particularly preferable to measure the positions of all of the limiting plates 81 and the vapor deposition source openings 61.

Although one limiting plate sensor 85 and one vapor deposition source sensor 65 are provided in FIG. 10, a plurality of limiting plate sensors 85 and a plurality of vapor deposition source sensors 65 may be provided. It is preferable to measure the positions of all of the limiting plates 81 and the vapor deposition source openings 61 to be measured, using one limiting plate sensor 85 and one vapor deposition source sensor 65. However, the limiting plates 81 and the vapor deposition source openings 61 to be measured may be divided into a plurality of groups, and one limiting plate sensor 85 and one vapor deposition source sensor 65 may be provided for each group.

The vapor deposition source opening 61 and the plurality of limiting plates 81 are spaced apart from each other in the Z axis direction, and the plurality of limiting plates 81 and the vapor deposition mask 70 are spaced apart from each other in the Z axis direction. The relative position between the vapor deposition source 60, the limiting plate unit 80, and the vapor deposition mask 70 is constant at least during vapor deposition by color, excluding a period during which the position of the limiting plate unit 80 is adjusted by the position adjustment mechanism 86.

The substrate 10 is held by a holding device 55. As the holding device 55, for example, an electrostatic chuck that holds the surface of the substrate 10 opposite to the deposition surface 10e of the substrate 10 with electrostatic force can be used. The substrate 10 can thereby be held substantially without the substrate 10 being bent by its own weight. However, the holding device 55 for holding the substrate 10 is not limited to an electrostatic chuck and may be any other device.

The substrate 10 held by the holding device 55 is scanned (moved) in the Y axis direction at a constant speed by a moving mechanism 56 with respect to the vapor deposition mask 70 on the opposite side from the vapor deposition source 60, with the substrate 10 being spaced apart from the vapor deposition mask 70 at a fixed interval.

The vapor deposition unit 50, the substrate 10, the holding device 55 for holding the substrate 10 and the moving mechanism 56 for moving the substrate 10 are housed in a vacuum chamber (not shown). The vacuum chamber is a hermetically sealed container, with its internal space being vacuumed and maintained to a predetermined low pressure state.

The vapor deposition particles 91 discharged from the vapor deposition source openings 61 pass through a limiting space 82 of the limiting plate unit 80, and a mask opening 71 of the vapor deposition mask 70 in this order. The deposition particles 91 adhere to the vapor deposition surface (specifically, the surface of the substrate 10 facing the vapor deposition mask 70) 10e of the substrate 10 traveling in the Y axis direction to form a coating film 90. The coating film 90 has a stripe shape extending in the Y axis direction.

The vapor deposition particles 91 that form the coating film 90 necessarily pass through the limiting space 82 and the mask opening 71. The limiting plate unit 80 and the vapor deposition mask 70 are designed so as to prevent a situation in which the vapor deposition particles 91 discharged from a vapor deposition source opening 61 reach the deposition surface 10e of the substrate 10 without passing through the limiting spaces 82 and the mask openings 71, and if necessary, a shielding plate (not shown) or the like that prevents flight of the vapor deposition particles 91 may be installed.

By performing vapor deposition three times by changing the vapor deposition material 91 for each color, namely, red, green and blue (vapor deposition by color), stripe-shaped coating films 90 (specifically, light emitting layers 23R, 23G and 23B) that correspond to the respective colors of red, green and blue can be formed on the deposition surface 10e of the substrate 10.

As with the limiting plates 981 of the new vapor deposition method shown in FIGS. 6 and 7, the limiting plates 81 limit the incidence angle of the vapor deposition particles 91 entering the mask openings 71 on a projection onto the XZ plane by causing the vapor deposition particles 91 having a large speed vector component in the X axis direction to collide with and adhere to the limiting plates 81. As used herein, "incidence angle" of the vapor deposition particles 91 with respect to a mask opening 71 is defined as the angle formed between the flight direction of the vapor deposition particles 91 entering the mask opening 71 and the Z axis on a projection onto the XZ plane. As a result, the amount of the vapor deposition particles 91 that pass through a mask opening 71 at a large incidence angle is reduced. Accordingly, the width We of the blur portion 90e shown in FIG. 8 is reduced, and preferably the occurrence of thickness tapered portions 90e will substantially be prevented, and thus the occurrence of blur at both edges of the stripe-shaped coating film 90 can be suppressed significantly. As a result, in the organic EL display device, the need to increase the width of the non-light-emitting region between light-emitting regions so as not to cause color mixing is eliminated. Accordingly, it is possible to achieve display of high definition and high brightness images. In addition, the need to increase the current density in the light emitting layers in order to enhance brightness is also eliminated, a long service life can be achieved and reliability can be improved.

In order to limit the incidence angle at the vapor deposition particles 91 enter the mask opening 71, the limiting plates 81 are used in the present embodiment. The dimension in the X axis direction of a limiting space 82 can be large, and the dimension in the Y axis direction can be set to substantially any value. Accordingly, the opening area of the limiting space 82 viewed from the vapor deposition source openings 61 is increased, and thus the amount of vapor deposition particles that adhere to the limiting plate unit 80 can be reduced, as a result of which the wasted vapor deposition material can be reduced. Also, clogging caused as a result of the vapor deposition material adhering to the limiting plates 81 is unlikely to occur, enabling continuous use for a long period of time and improving the mass productivity of the organic EL display device. Furthermore, because the opening area of the limiting plate 82 is large, the vapor deposition material that has adhered to the limiting plates 81 can be easily washed off, enabling simple maintenance and reducing the losses due to stop of mass production, as a result of which the mass productivity can be further improved.

In the present embodiment, the positions of the limiting plates 81 and the vapor deposition source openings 61 are detected using the limiting plate sensor 85 and the vapor deposition source sensor 65, and in the case where detrimental relative positional offset in the X axis direction occurs therebetween, the position of the limiting plate unit 80 (that is, the limiting plates 81) in the X axis direction is corrected using a position control mechanism 86.

A vapor deposition method of the present embodiment that corrects the position of the limiting plate unit 80 will be described below.

Figure 12:
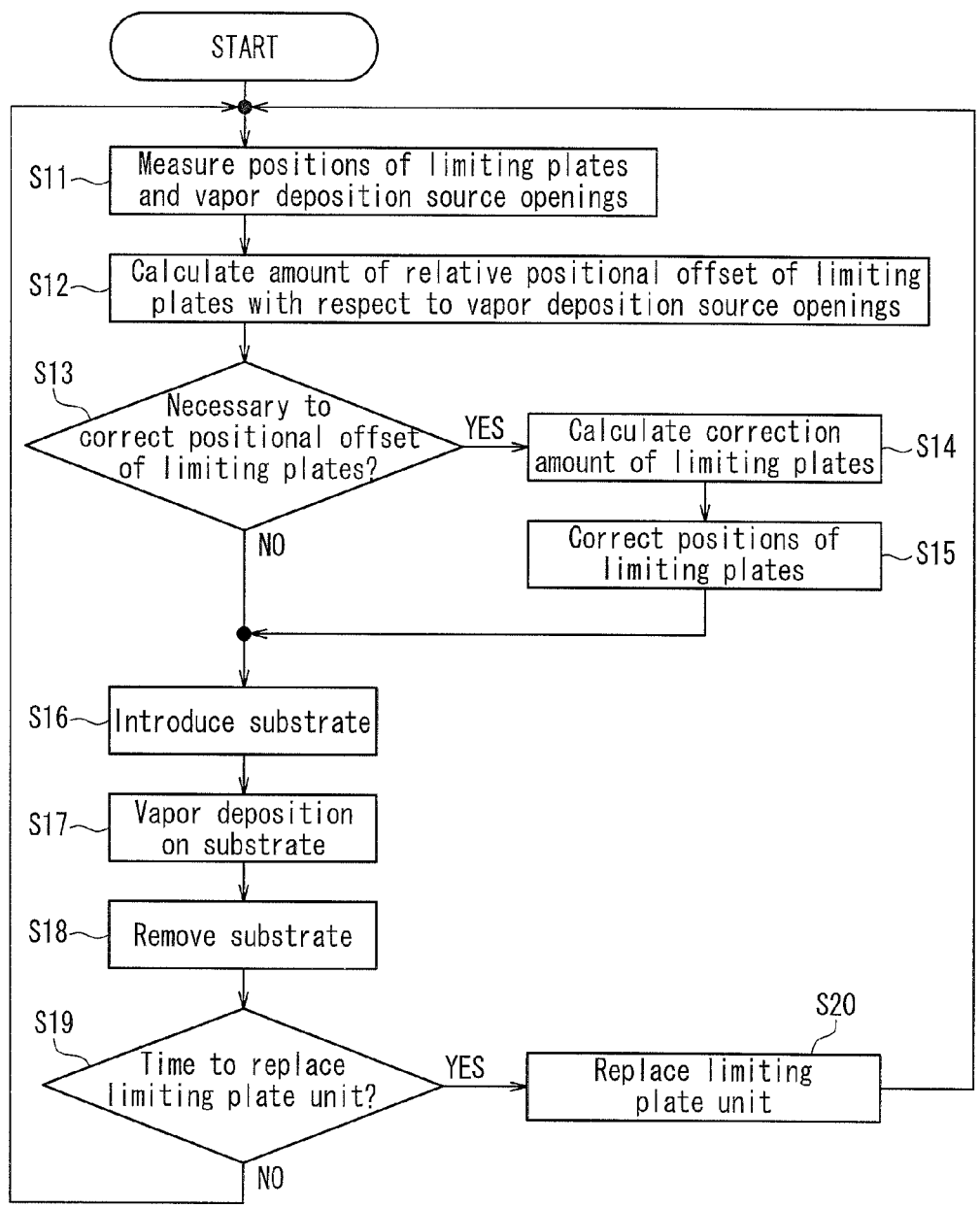
FIG. 12 is a flowchart of the vapor deposition method using the vapor deposition device according to Embodiment 1 of the present invention.

FIG. 12 is a flowchart of the vapor deposition method using the vapor deposition device according to Embodiment 1 of the present invention.

First, the positions of the limiting plates 81 and the vapor deposition source openings 61 are measured (step S11). The positions of the limiting plates 81 are measured using the limiting plate sensor 85, and the positions of the vapor deposition source openings 61 are measured using the vapor deposition source sensor 65.

Next, the amount of relative positional offset of the limiting plates 81 with respect to the vapor deposition source openings 61 is calculated based on the respective measured positions of the limiting plates 81 and the vapor deposition source openings 61 (step S12). Here, "the amount of the relative positional offset of the limiting plates 81 with respect to the vapor deposition source openings 61" refers to the offset amount of the relative position between the vapor deposition source opening 61 and the limiting plates 81 defining the limiting space 82 designed to allow the passage of the vapor deposition particles 91 discharged from the vapor deposition source opening 61, from the designed value. In the case of the design in which the vapor deposition particles 91 that can pass through the limiting space 82 are discharged only from the vapor deposition source opening 61 located directly below the limiting space 82 as shown in FIG. 11, the relative position of two limiting plates 81 that are closest to the vapor deposition source opening 61 with respect to the vapor deposition source opening 61 is determined. The difference between the relative position and the designed value can be used as the amount of relative positional offset. In the case where the positions of all of the limiting plates 81 and the vapor deposition source openings 61 are measured in step S11, it is preferable to calculate the amount of relative positional offset with respect to all of the limiting plates 81 and the vapor deposition source openings 61.

Next, it is determined whether or not it is necessary to correct the relative positional offset of the limiting plates 81 with respect to the vapor deposition source openings 61 (step S13). For example, the determination can be made by comparing the amount of relative positional offset calculated in step S12 with a threshold value set in advance. The threshold value used in this case can be set taking into consideration conditions under which the required coating film 90a is not formed and/or conditions under which the undesired coating film 90b is formed as described in FIG. 9B, for example. In the case where a plurality of amounts of relative positional offset are calculated in step S12, it is desirable to make a determination with regard to each of the amounts of relative positional offset.

In the case where it has been determined that it is not necessary to correct the relative positional offset in step S13, step S16 that will be described later is performed.

In the case where it has been determined that it is necessary to correct the relative positional offset in step S13, the correction amount of the limiting plates 81 is calculated (step S14). In the present embodiment, the limiting plate unit 80 is moved as a whole. Therefore, an optimal movement amount (correction amount) of the limiting plate unit 80 is calculated.

Next, the positions of the limiting plates 81 in the X axis direction are corrected based on the correction amount determined in step S13 (step S15). In the present embodiment, the entire limiting plate unit 80 is moved in the X axis direction using the position adjustment mechanism 86.

Next, the substrate 10 is introduced into the vapor deposition device (step S16), and vapor deposition is performed to form the coating film 90 on the deposition surface 10e of the substrate 10 (step S17). After the coating film 90 is formed, the substrate 10 is removed from the vapor deposition device (step S18).

Next, it is determined whether or not it is a time to replace the limiting plate unit 80 (step S19). Similarly to the case of the above-described new vapor deposition method, the vapor deposition material adheres to the limiting plate unit 80. Therefore, it is necessary to replace the limiting plate unit 80 to which the vapor deposition material adhered by a new one. The determination whether or not it is a time of replacement can be made by comparing, with a predetermined threshold value, the deposition thickness of the vapor deposition material determined by a method for directly measuring the thickness of the vapor deposition material deposited on the limiting plate unit 80, a method for estimating the thickness of the vapor deposition material deposited on the limiting plate unit 80 based on the amount of the vapor deposition material deposited on members other than the limiting plate unit 80, a method for estimating the thickness of the vapor deposition material deposited on the limiting plate unit 80 based on a total time period of vapor deposition performed after the limiting plate unit 80 is previously replaced, or the like.

In the case where it has been determined in step S19 that it is a time to replace the limiting plate unit 80, the limiting plate unit 80 is replaced (step S20), and the procedure returns to step S11. Therefore, before the subsequent vapor deposition, the amount of relative positional offset of the limiting plates 81 with respect to the vapor deposition source openings 61 due to the replacement of the limiting plate unit 80, temperature changes thereof, or the like are measured and corrected as necessary.

In the case where it has been determined in step S19 that it is not a time to replace the limiting plate unit 80, the limiting plate unit 80 is not replaced, and the procedure returns to step S11. Therefore, before the subsequent vapor deposition, the amount of relative positional offset of the limiting plates 81 with respect to the vapor deposition source openings 61 due to temperature changes thereof, or the like are measured and corrected as necessary.

As described above, according to the present embodiment, before the subsequent vapor deposition is performed on the substrate 10, it is determined whether or not it is necessary to correct the positions of the limiting plates 81 in the X axis direction by calculating the amount of relative positional offset of the limiting plates 81 with respect to the vapor deposition source openings 61 (step S13), and in the case where it is necessary to correct the position, the position of the limiting plate unit 80 in the X axis direction is corrected (step S15). Therefore, the positional offset is corrected before vapor deposition even if the limiting plates 81 are positionally offset in the X axis direction with respect to the vapor deposition source openings 61 due to replacement of the limiting plate unit 80, a difference in thermal expansion amounts between the limiting plate unit 80 and the vapor deposition source 60, or the like, and therefore the coating film 90 always can be stably formed at a desired position on the substrate 10.

The above-described flowchart shown in FIG. 12 is an example, and can be changed as appropriate.

For example, in FIG. 12, in the case where it has been determined in step S19 that it is not a time to replace the limiting plate unit 80, the procedure may return to step S16 instead of step S11. This can be applicable to the case where an assumption can be made that if the limiting plate unit 80 is not replaced, the temperature does not change and thus the relative position of the limiting plates 81 with respect to the vapor deposition source openings 61 does not change.

In the above-described FIG. 12, it is determined whether or not it is necessary to correct the positions of the limiting plates 81 (step S13) before the vapor deposition is performed on the substrate 10 (step S17), and in the case where it is necessary to correct the position, the position of the limiting plate unit 80 is corrected (step S15). Instead of this, or in addition to this, during vapor deposition on the substrate 10, the relative position of the limiting plates 81 with respect to the vapor deposition source openings 61 is continuously measured and it is determined whether or not it is necessary to correct the positions of the limiting plates 81 in the X axis direction, and in the case where it is determined that it is necessary to correct the positions of the limiting plates 81, the position of the limiting plate unit 80 may be corrected. With this method, in the case where the limiting plates 81 are positionally offset with respect to the vapor deposition source openings 61 due to the temperature change or the like during vapor deposition, the positional offset can be immediately corrected, and therefore the accuracy in the formation of the coating film is further improved. However, it is necessary to highly accurately perform at a high speed a series of the steps of measuring the positions of the limiting plates 81 and the vapor deposition source openings 61, determining the necessity of correction, calculating the required correction amount, and moving the limiting plate unit 80, and therefore there is a possibility of the complication of the control device, an increase in the device cost and the like.

In the above-described vapor deposition device shown in FIGS. 10 and 11, the limiting plate sensor 85 and the vapor deposition source sensor 65 can be omitted. In this case, in order to determine whether or not it is necessary to correct the positions of the limiting plates 81 in the X axis direction, trial vapor deposition is performed on the substrate for checking before vapor deposition on the substrate 10. This will be described below.

Figure 13:
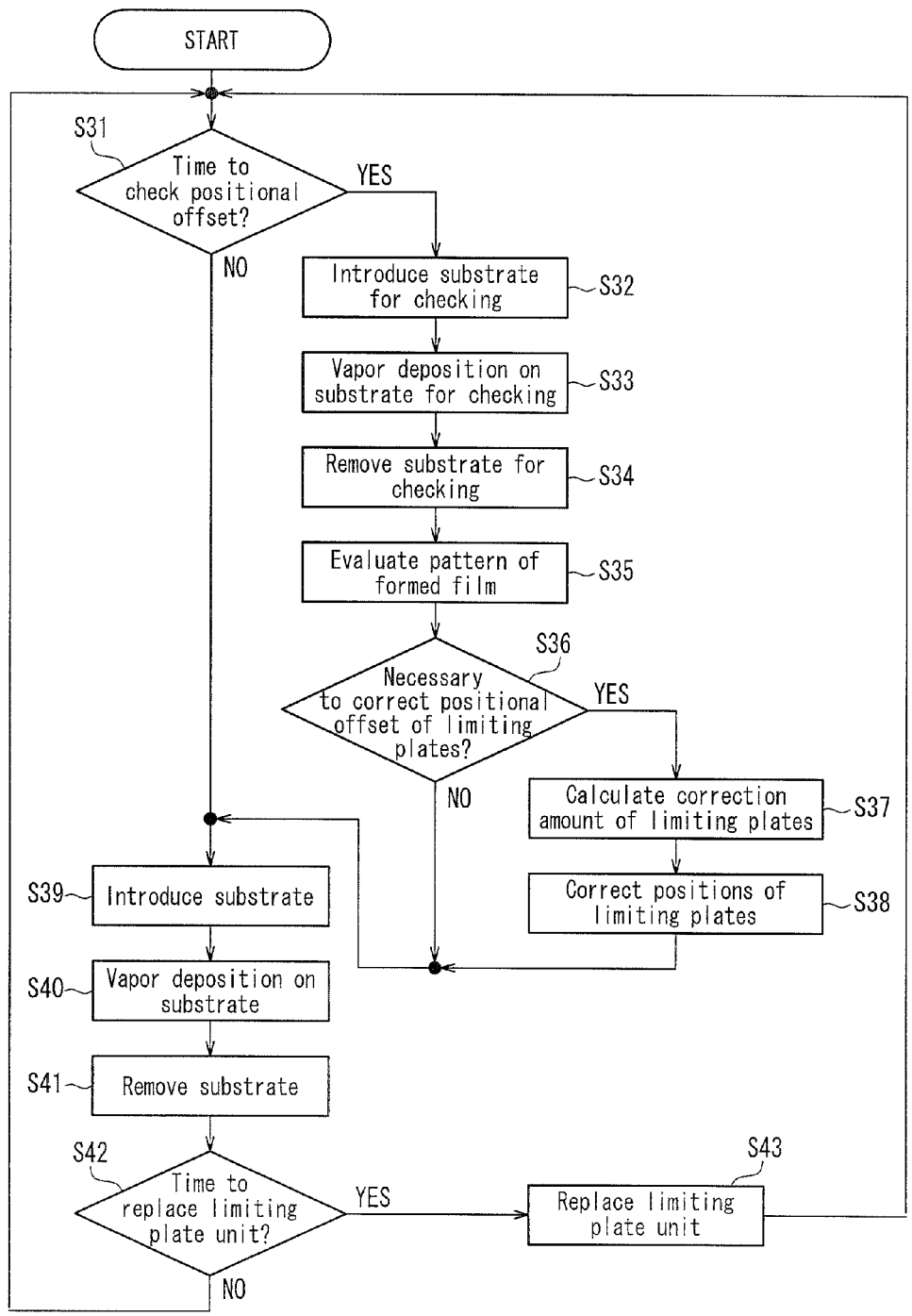
FIG. 13 is a flowchart of a vapor deposition method using another vapor deposition device according to Embodiment 1 of the present invention.

FIG. 13 is a flowchart of the vapor deposition method using the vapor deposition device according to Embodiment 1 in which the limiting plate sensor 85 and the vapor deposition source sensor 65 are omitted.

First, it is determined whether or not it is a time to check the positional offset of the limiting plates 81 with respect to the vapor deposition source openings 61 (step S31). The determination can be performed based on whether or not the vapor deposition device was just started up, whether or not the limiting plate unit 80 was replaced, whether or not vapor deposition conditions (for example, temperature conditions of the vapor deposition source 60 and the like) were changed, a time period elapsed since the previous positional offset check, or the like.

In the case where it has been determined in step S31 that it is necessary to check the positional offset of the limiting plates 81, the substrate for checking is introduced into the vapor deposition device (step S32), vapor deposition (trial vapor deposition) is performed on the substrate for checking (step S33), and the substrate for checking is removed from the vapor deposition device (step S34). It is preferable that the substrate for checking is a substrate on which vapor deposition is performed under the same conditions as those for the substrate 10. It is preferable to use TFT substrates, substrates whose deposition surface has a predetermined pattern, and the like because the evaluation of the coating film in step S35 that will be described later will become easy.

Next, the coating film formed on the substrate for checking is evaluated (step S35). For example, it is possible to determine the amount of offset of a position at which the coating film is actually formed with respect to the position at which the coating film is desired to be formed.

Next, it is determined whether or not it is necessary to correct the relative positional offset of the limiting plates 81 with respect to the vapor deposition source openings 61 based on the evaluation result obtained in step S35 (step S36). For example, as can be understood from FIG. 9B, in the case where the coating film formed on the substrate for checking is positionally offset in the X axis direction from a desired position, it is possible to estimate that the cause of the positional offset lies in the positional offset of the limiting plates 81 relative to the vapor deposition source openings 61. Therefore, it is possible to determine whether or not it is necessary to correct the positional offset of the limiting plates 81, by comparing the amount of positional offset of the coating film determined in step S35 with the threshold value set in advance.

In the case where it has been determined in step S36 that it is not necessary to correct the relative positional offset, step S39 that will be described later is performed.

In the case where it has been determined in step S36 that it is necessary to correct the relative positional offset, the correction amount of the limiting plates 81 is calculated (step S37). In the present embodiment, the limiting plate unit 80 is moved as a whole. Therefore, an optimal movement amount (correction amount) of the limiting plate unit 80 is calculated.

Next, the positions of the limiting plates 81 in the X axis direction are corrected based on the correction amount determined in step S37 (step S38). In the present embodiment, the entire limiting plate unit 80 is moved in the X axis direction using the position adjustment mechanism 86.

Next, the substrate (substrate on which light emitting layers 23R, 23G and 23B are to be formed) 10 is introduced into the vapor deposition device (step S39), and vapor deposition is performed to form the coating film 90 on the deposition surface 10e of the substrate 10 (step S40). After the coating film 90 is formed, the substrate 10 is removed from the vapor deposition device (step S41).

Next, it is determined whether or not it is a time to replace the limiting plate unit 80 (step S42). This determination can be performed similarly to step S19 of the flowchart shown in FIG. 12.

In the case where it has been determined in step S42 that it is a time to replace the limiting plate unit 80, the limiting plate unit 80 is replaced (step S43), and the procedure returns to step S31.

In the case where it has been determined in step S42 that it is not a time to replace the limiting plate unit 80, the limiting plate unit 80 is not replaced, and the procedure returns to step S31.

As described above, according to the flowchart shown in FIG. 13, it is possible to omit the limiting plate sensor 85 and the vapor deposition source sensor 65, and therefore the configuration of the vapor deposition device is simplified and the device cost and the vapor deposition cost can be reduced. However, it is necessary to perform trial vapor deposition on the substrate for checking in order to determine whether or not it is necessary to correct the positions of the limiting plates 81 in the X axis direction, and therefore the operation for determining whether or not it is necessary to correct the positions of the limiting plates 81 is complicated as compared with the flowchart shown in FIG. 12. Therefore, determining whether or not it is necessary to correct the position for each vapor deposition on one substrate 10 reduces the throughput at the time of mass production, and therefore is not realistic. Therefore, the flowchart of FIG. 12 is preferable to the flowchart of FIG. 13 in view of accuracy in the position of the coating film.

As described above, according to Embodiment 1, the limiting plate unit 80 is provided between the vapor deposition source 60 and the vapor deposition mask 70, and therefore similarly to the new vapor deposition method shown in FIGS. 5 and 6, the width We (see FIG. 8) of the blur portion 90e at the edge of the coating film 90 can be reduced. Furthermore, it is determined whether or not it is necessary to correct the positions of the limiting plates 81 in the X axis direction with respect to the vapor deposition source openings 61, and in the case where it is necessary to correct the position, the position of the limiting plate unit 80 in the X axis direction is corrected, and therefore the coating film 90 can be stably formed at a desired position on the substrate 10.

For example, in the case where the limiting plate unit 80 is replaced, there is a possibility that the limiting plates 81 is positionally offset with respect to the vapor deposition source openings 61. Even in such a case, the positional offset can be corrected before vapor deposition is performed on the substrate 10, and therefore a drop in the productivity or an efficiency percentage due to the maintenance of the vapor deposition device can be reduced.

Also, in the case of a large-sized vapor deposition device, the amount of thermal expansion is increased, and therefore the amount of positional offset of the limiting plates 81 with respect to the vapor deposition source openings 61 is also likely to increase. Even in such a case, the present invention can correct the positional offset, and therefore can be preferably applicable to large-sized vapor deposition devices.

Embodiment 2

Figure 14:
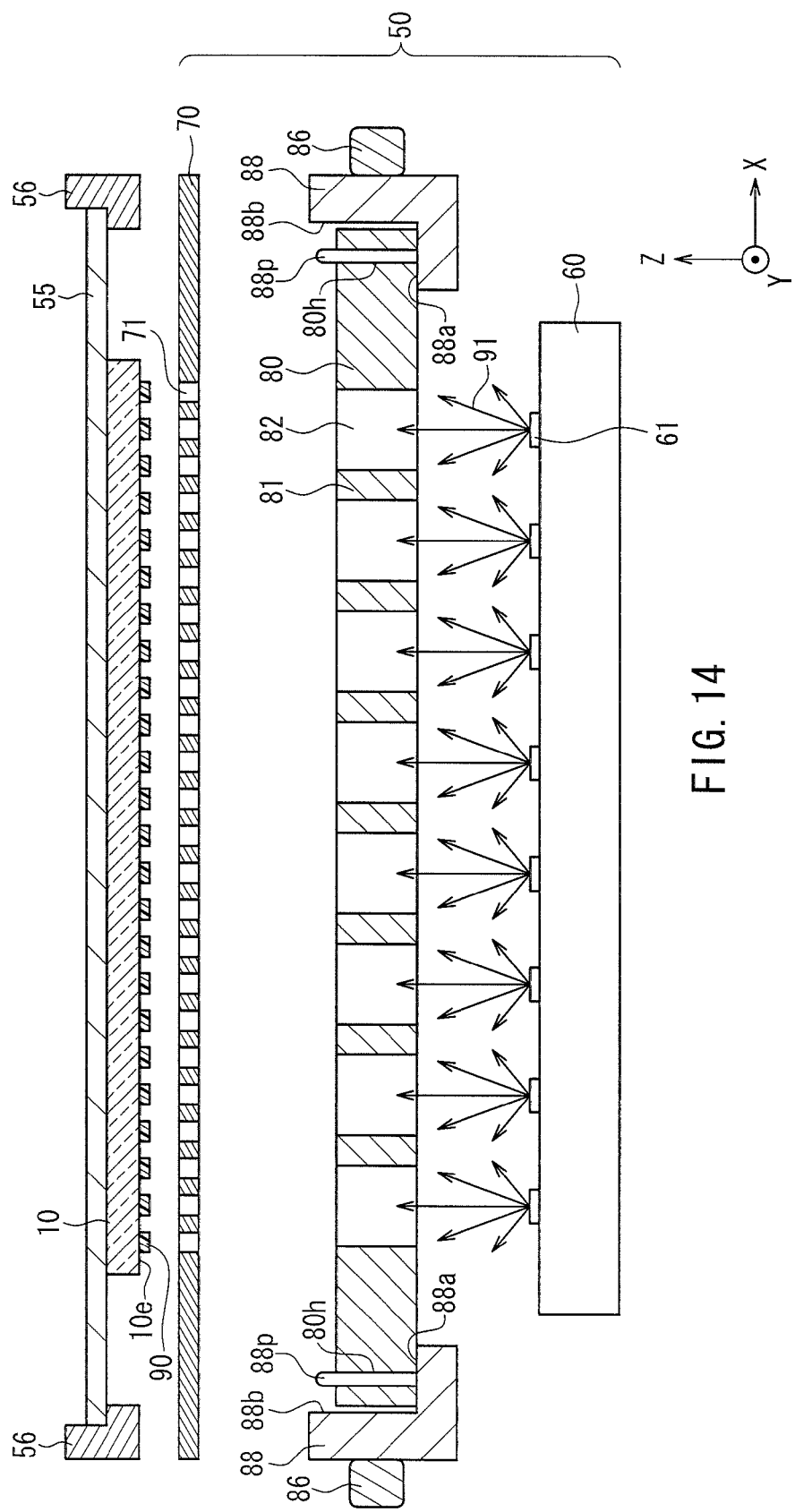
FIG. 14 is a front cross-sectional view of a vapor deposition device according to Embodiment 2 of the present invention as viewed in a direction parallel to the traveling direction of a substrate.

FIG. 14 is a front cross-sectional view of a vapor deposition device according to Embodiment 2 of the present invention, as viewed from a direction parallel to the traveling direction of the substrate 10. In FIG. 14, the same reference numerals are given to the same members as the members shown in FIGS. 10 and 11 that show the vapor deposition device according to Embodiment 1, and a description thereof will be omitted. Hereinafter, Embodiment 2 will be described, focusing on differences from Embodiment 1.

In Embodiment 2, the limiting plate unit 80 is placed on the limiting plate tray 88. The position adjustment mechanism 86 adjusts (corrects) the position of the limiting plate tray 88 in the X axis direction.

The limiting plate tray 88 has a substantially rectangular frame shape with an opening region that faces the region where the plurality of limiting spaces 82 of the limiting plate unit 80 are formed. As shown in FIG. 14, each side of the limiting plate tray 88 has a substantially "L"-shaped cross section that includes a placement surface 88a that is substantially perpendicular to the Z axis and a surrounding wall 88b that is substantially parallel to the Z axis. A positioning pin 88p extends upright from the placement surface 88a and is parallel to the Z axis. A positioning hole 80h into which the positioning pin 88p is to be inserted is formed on the limiting plate unit 80. It is preferable that at least two or more positioning pins 88p and positioning holes 80h are respectively formed.

When the limiting plate unit 80 is thrown into the region surrounded by the surrounding walls 88b of the limiting plate tray 88, the positioning pins 88p fits in the positioning holes 80h. Accordingly, the limiting plate unit 80 is positioned in the X axis direction and the Y axis direction with respect to the limiting plate tray 88. Also, the limiting plate unit 80 is positioned in the Z axis direction with respect to the limiting plate tray 88 by making contact with the placement surface 88a.

If the position adjustment mechanism 86 adjusts (corrects) the position of the limiting plate tray 88 in the X axis direction, the position of the limiting plate unit 80 placed on the limiting plate tray 88 in the X axis direction can be adjusted (corrected).

Embodiment 2 is the same as Embodiment 1 except for the above. As described in Embodiment 1, it is determined whether or not it is necessary to correct the positions of the limiting plates 81 in the X axis direction with respect to the vapor deposition source openings 61, and in the case where it is necessary to correct the position, the position of the limiting plate unit 80 in the X axis direction is corrected (see FIGS. 12 and 13). Therefore, effects similar to Embodiment 1 are achieved.

In the present embodiment, the limiting plate unit 80 is accurately positioned and only placed on the limiting plate tray 88, and the position adjustment mechanism 86 is attached to the limiting plate tray 88. Therefore, it is possible to perform the replacement of the limiting plate unit 80 in a shorter time than in Embodiment 1 in which the position adjustment mechanism 86 is attached to the limiting plate unit 80. Accordingly, the throughput at the time of mass production and performance of maintenance are improved. Also, it is possible to increase the frequency at which the limiting plate unit 80 is replaced without decreasing the throughput, and therefore the limiting plate unit 80 to which only a small amount of the vapor deposition material adheres can be always used. Therefore, the vapor deposition material deposited on the limiting plate unit 80 does not fall on the vapor deposition source 60 or the vapor deposition source openings 61, and does not decrease the dimension of the opening of the limiting spaces 82, and therefore vapor deposition can be stably performed with high accuracy.

Also, according to the present embodiment, when the limiting plate unit 80 is replaced, the limiting plate unit 80 can be positioned accurately with respect to the limiting plate tray 88 only by placing new limiting plate unit 80 on the limiting plate tray 88. Therefore, the positional offset of the limiting plates 81 with respect to the vapor deposition source openings 61 due to the replacement of the limiting plate unit 80 is unlikely to occur, as compared with Embodiment 1. Therefore, it is possible to reduce the frequency at which the positional offset of the limiting plate unit 80 is corrected after the replacement of the limiting plat unit 80 and a time period required therefore. As a result, the throughput at the time of mass production is improved.

Note that although the structure in which the positioning pins 88p fit in the positioning holes 80h was used as a structure for positioning the limiting plate unit 80 with respect to the limiting plate tray 88 in FIG. 14, the present invention is not limited to this. For example, the positioning may be performed by bringing a protrusion formed on either one of the outer circumferential surface of the limiting plate unit 80 and the surrounding walls 88b of the limiting plate tray 88 into contact with the other.

Embodiment 3

Figure 15:
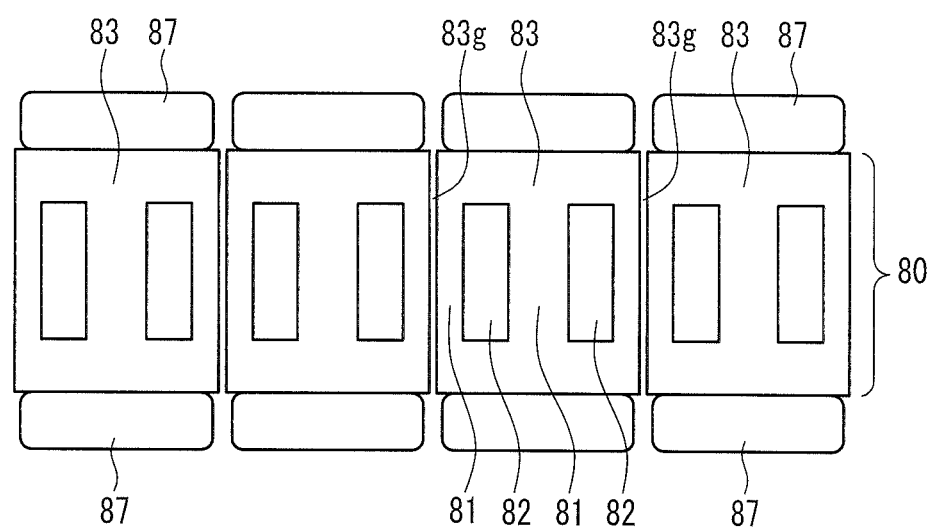
FIG. 15 is a plan view of a limiting plate unit that constitutes the vapor deposition device according to Embodiment 3 of the present invention.
Figure 16:
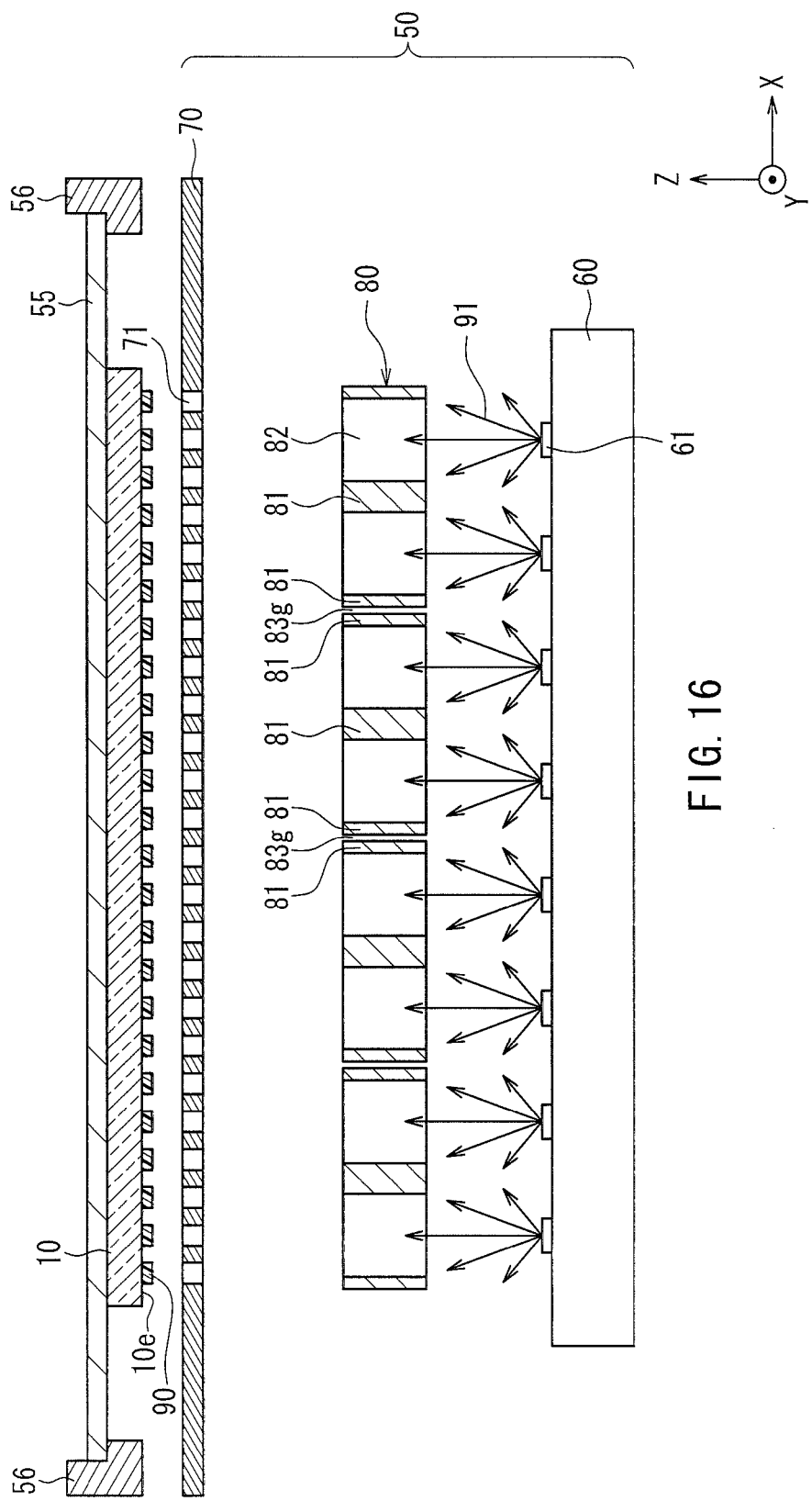
FIG. 16 is a front cross-sectional view of a vapor deposition device according to Embodiment 3 of the present invention as viewed in a direction parallel to the traveling direction of a substrate.

FIG. 15 is a plan view of the limiting plate unit 80 that constitutes a vapor deposition device according to Embodiment 3 of the present invention. FIG. 16 is a front cross-sectional view of the vapor deposition device according to Embodiment 3 as viewed in a direction parallel to the traveling direction of a substrate. In FIGS. 15 and 16, the same reference numerals are given to the same members as the members shown in FIGS. 10 and 11 that show the vapor deposition device according to Embodiment 1, and a description thereof will be omitted. Hereinafter, Embodiment 3 will be described, focusing on differences from Embodiment 1.

In Embodiment 3, the limiting plate unit 80 are divided into a plurality of unit parts 83. The plurality of unit parts 83 have the same specification, and each includes a plurality of the limiting plates 81 arranged in the X axis direction at a predetermined pitch. A space between limiting plates 81 neighboring in the X axis direction is the limiting space 82 through which the vapor deposition particles 91 pass.

The plurality of unit parts 83 are arranged in the X axis direction. A plurality of the position adjustment mechanisms 87 are provided for the plurality of unit parts 83 in a one-to-one correspondence so as to independently adjust (correct) the respective positions of the plurality of unit parts 83 in the X axis direction. Similarly to the position adjustment mechanism 86 in Embodiment 1, the position adjustment mechanism 87 may be a screw mechanism that is capable of manually moving the unit part 83 in the X axis direction, for example, or may be a motor-driven mechanism that includes a known actuator such as a motor or the like and that is controlled by electric signals.

A gap 83g is formed between unit parts 83 neighboring in the X axis direction in order to independently correct the position of each unit part 83 in the X axis direction. The gap 83g is can be narrow as long as it is capable of correcting the positions of the unit parts 83 in the X axis direction, and is narrow. Therefore, the vapor deposition particles 91 cannot pass through the gap 83g to enter the mask openings 71.

It is preferable to measure the positions of all of the limiting plates 81 of the plurality of unit parts 83 using one or a plurality of limiting plate sensors 85.

Embodiment 3 is the same as Embodiment 1 except for the above. As described in Embodiment 1, it is determined whether or not it is necessary to correct the positions of the limiting plates 81 in the X axis direction with respect to the vapor deposition source openings 61, and in the case where it is necessary to correct the position, the respective positions of the unit parts 83 in the X axis direction are independently corrected. Therefore, as compared with Embodiment 1 in which the entire limiting plate unit 80 is moved in the X axis direction and corrected, the positional offset of the limiting plates 81 with respect to the vapor deposition source openings 61 can be corrected for each unit part 83 in Embodiment 3, and therefore it is possible to correct the positions with high accuracy. Therefore, it is possible to further reduce the positional offset of the coating film 90 to be formed on the substrate 10.

Although two limiting spaces 82 are formed in one unit part 83 in FIGS. 15 and 16, the number of limiting spaces 82 formed in one unit part 83 may be smaller or larger than this. If the limiting plate unit 80 is divided into a plurality of unit parts 83 so that one unit part 83 includes only one limiting space 82, it is possible to correct the positions with higher accuracy. Alternatively, in order to reduce the complication to correct the position for each unit part 83, the limiting plate unit 80 may be divided into a plurality of unit parts 83 so that one unit part 83 includes three or more limiting spaces 82.

Although the division positions for dividing the limiting plate unit 80 into a plurality of unit parts 83 were provided on the limiting plates 81 in FIGS. 15 and 16, the present invention is not limited to this and they may be provided in the limiting spaces 82. For example, the limiting plate unit 80 may be divided in a region between the limiting plates 81 neighboring in the X axis direction so that one unit part 83 includes only one limiting plate 81. In this case, the opening width of the limiting space 82 in the X axis direction can be adjusted by correcting the position of the unit part 83 in the X axis direction using the position adjustment mechanism 87. With this configuration, the positional offset of the limiting plates 81 in the X axis direction with respect to the vapor deposition source openings 61 can be corrected for each limiting plate 81, and therefore it is possible to correct the position with higher accuracy.

In FIGS. 15 and 16, the position adjustment mechanism 87 was directly attached to the unit part 83. However, for example, as in Embodiment 2, the plurality of unit parts 83 may be respectively placed on the plurality of limiting plate trays that were divided so as to correspond in one to one to the unit parts 83, and the position adjustment mechanism 87 may be attached to each of the plurality of limiting plate trays. It is preferable that a positioning structure for positioning the unit part 83 with respect to the limiting plate tray is provided in the unit part 83 and/or the limiting plate tray. With this configuration, the replacement of the unit parts 83 can be easily performed in a short time as described in Embodiment 2. Also, the order of arrangement of the unit parts 83 in the X axis direction is arbitrary due to the plurality of unit parts 83 having the same specification, and therefore the operation for replacing the unit parts 83 will not be complicated even if the number of unit parts 83 to be replaced is increased. Furthermore, a dummy unit part having the same specification except that the limiting space 82 (through hole) is not formed may be produced, and in the case where the width of the substrate 10 (dimension in the X axis direction) is small, the vapor deposition width can be easily reduced by arranging the dummy unit parts on both ends in the X axis direction.

Although the plurality of unit parts 83 have the same specification in the above-described example, the present invention is not limited to this, and some of the plurality of unit parts 83 may have a different specification.

Embodiments 1 to 3 described above are merely examples. The present invention is not limited to Embodiments 1 to 3 described above, and can be changed as appropriate.

In the above-described embodiments, the positional offset of the limiting plates 81 in the X axis direction with respect to the vapor deposition source openings 61 were corrected. This is for solving problems that if the limiting plates 81 are positionally offset in the X axis direction, the coating film is not formed at a desired position, or the coating film is formed at an undesired position. In the present invention, an allowable range of the positional offset of the limiting plate unit 80 including the limiting plates 81 and the limiting spaces 82 is significantly wider in the Y axis direction than in the X axis direction.

However, in the present invention, a position adjustment mechanism for correcting positional offset of the limiting plates 81 in the Y axis direction may be further provided. The amount of a vapor deposition material captured by the limiting plate unit 80 can be reduced by correcting the positional offset of the limiting plates 81 in the Y axis direction with respect to the vapor deposition source openings 61, and therefore utilization efficiency of the vapor deposition material can be improved.

Alternatively, a rotation position adjustment mechanism for correcting offset in a rotational direction in the XY plane of the limiting plates 81 may be further provided. If the limiting plates 81 have rotational offset in the XY plane, at least parts of the limiting plates 81 are positionally offset in the X axis direction due to the rotational offset, resulting in the above-described problems. The positional offset of the limiting plates 81 in the X axis direction caused from the rotational offset can be corrected by providing the rotation position adjustment mechanism for correcting the rotational offset of the limiting plates 81.

The detection and correction of the positional offset and the rotational offset of the limiting plates 81 in the Y axis direction can be performed similarly to FIGS. 12 and 13 described in Embodiment 1. The position adjustment mechanism or the rotation position adjustment mechanism in the Y axis direction may be directly attached to the limiting plate unit 80 similarly to Embodiment 1, or may be attached to the limiting plate tray in which the limiting plate unit 80 is mounted similarly to Embodiment 2. Furthermore, similarly to Embodiment 3, the positional offset or the rotational offset in the Y axis direction of each of the divided unit parts 83 may be independently corrected for each unit part 83.

If the substrate 10 has a large dimension in the X axis direction, a plurality of vapor deposition units 50 as shown in the above-described embodiments may be arranged at different positions in the X axis direction and in the Y axis direction.

In Embodiments 1 to 3 described above, the substrate 10 is moved relative to the vapor deposition unit 50 that is stationary, but the present invention is not limited thereto. It is sufficient that one of the vapor deposition unit 50 and the substrate 10 is moved relative to the other. For example, it may be possible to fix the position of the substrate 10 and move the vapor deposition unit 50. Alternatively, both the vapor deposition unit 50 and the substrate 10 may be moved.

In Embodiments 1 to 3 described above, the substrate 10 is disposed above the vapor deposition unit 50, but the relative positional relationship between the vapor deposition unit 50 and the substrate 10 is not limited thereto. It may be possible to, for example, dispose the substrate 10 below the vapor deposition unit 50 or dispose the vapor deposition unit 50 and the substrate 10 so as to oppose each other in the horizontal direction.

INDUSTRIAL APPLICABILITY

There is no particular limitation on the fields to which the vapor deposition device and vapor deposition method of the present invention can be applied, and the present invention is preferably used to form light emitting layers for use in organic EL display devices.

DESCRIPTION OF SYMBOLS

10 Substrate
10*e* Deposition Surface
20 Organic EL Element
23R, 23G, 23B Light Emitting Layer
50 Vapor Deposition Unit
56 Moving Mechanism
60 Vapor Deposition Source
61 Vapor Deposition Source Opening
65 Vapor Deposition Source Sensor
70 Vapor Deposition Mask
71 Mask Opening
80 Limiting Plate Unit
80*h* Positioning Hole
81 Limiting Plate
82 Limiting Space
83 Unit Parts
83*g* Gap
85 Limiting Plate Sensor
86,87 Position Adjustment Mechanism
88 Limiting Plate Tray
88*a* Placement Surface
88*b* Surrounding Wall
88*p* Positioning Pin

The invention claimed is:

1. A vapor deposition device for forming a coating film having a predetermined pattern on a substrate, comprising:
    a vapor deposition unit including a vapor deposition source having a plurality of vapor deposition source openings that are disposed at different positions in a first direction, a vapor deposition mask disposed between the plurality of vapor deposition source openings and the substrate, and a limiting plate unit that includes a plurality of limiting plates disposed along the first direction and that is disposed between the vapor deposition source and the vapor deposition mask;
    a moving mechanism that moves one of the substrate and the vapor deposition unit relative to the other along a second direction orthogonal to the normal line direction of the substrate and the first direction in a state in which the substrate and the vapor deposition mask are spaced apart at a fixed interval;
    a limiting plate sensor that measures the position of at least one of the plurality of limiting plates in the first direction;
    a vapor deposition source sensor that measures the position of at least one of the plurality of vapor deposition source openings in the first direction; and
    a position adjustment mechanism that corrects the position of at least one of the plurality of limiting plates in the first direction, wherein
        the limiting plate unit is divided into a plurality of unit parts in the first direction, and
        the position adjustment mechanism independently moves each of the plurality of unit parts in the first direction.

2. The vapor deposition device according to claim 1, wherein the position adjustment mechanism moves the entire limiting plate unit in the first direction.

3. The vapor deposition device according to claim 1, further comprising a limiting plate tray on which the limiting plate unit is placed,
    wherein the position adjustment mechanism moves the limiting plate tray in the first direction.

4. The vapor deposition device according to claim 3, wherein a positioning structure for positioning the limiting plate unit with respect to the limiting plate tray is provided on the limiting plate tray and/or the limiting plate unit.

5. The vapor deposition device according to claim 1, wherein the plurality of unit parts are respectively placed on a plurality of limiting plate trays that are independent of each other, and the position adjustment mechanism independently moves each of the plurality of limiting plate trays in the first direction.

\* \* \* \* \*